US010796837B2

United States Patent
Ito et al.

(10) Patent No.: US 10,796,837 B2
(45) Date of Patent: Oct. 6, 2020

(54) ELECTRONIC COMPONENT, DIAPHRAGM, AND ELECTRONIC DEVICE

(71) Applicant: Murata Manufacturing Co., Ltd., Nagaokakyo-shi, Kyoto-fu (JP)

(72) Inventors: Shingo Ito, Nagaokakyo (JP); Naoki Gouchi, Nagaokakyo (JP); Kosuke Takeuchi, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 160 days.

(21) Appl. No.: 16/188,430

(22) Filed: Nov. 13, 2018

(65) Prior Publication Data
US 2019/0096558 A1 Mar. 28, 2019

Related U.S. Application Data

(63) Continuation of application No. PCT/JP2017/020188, filed on May 31, 2017.

(30) Foreign Application Priority Data

Jun. 7, 2016 (JP) .................................. 2016-113494
Aug. 4, 2016 (JP) .................................. 2016-153421
(Continued)

(51) Int. Cl.
*H01F 17/00* (2006.01)
*H01F 41/04* (2006.01)
(Continued)

(52) U.S. Cl.
CPC .......... *H01F 17/0013* (2013.01); *B06B 1/04* (2013.01); *H01F 7/20* (2013.01); *H01F 27/2804* (2013.01);
(Continued)

(58) Field of Classification Search
CPC ...... H01F 7/20; H01F 27/292; H01F 17/0013; H01F 41/041; H01F 27/2804;
(Continued)

(56) References Cited

U.S. PATENT DOCUMENTS

| 5,519,582 A | 5/1996 | Matsuzaki |
| 2009/0256668 A1 | 10/2009 | Noma et al. |

(Continued)

FOREIGN PATENT DOCUMENTS

| JP | 60-052668 U | 4/1985 |
| JP | 06-120036 A | 4/1994 |

(Continued)

OTHER PUBLICATIONS

Official Communication issued in International Patent Application No. PCT/JP2017/020188, dated Aug. 29, 2017.

*Primary Examiner* — Mohamad A Musleh
(74) *Attorney, Agent, or Firm* — Keating & Bennett, LLP

(57) ABSTRACT

An electronic component includes an insulating base material including insulating base material layers, a first main surface that is a mounting surface, a coil, mounting electrodes provided on the first main surface, and a projection. The coil includes coil conductors provided on the insulating base material layers and a winding axis in a laminating direction of the insulating base material layers. The projection is provided in an electrode non-forming portion of the first main surface, the electrode non-forming portion including no mounting electrodes therein, and provided along the coil conductors in planar view of the first main surface.

20 Claims, 24 Drawing Sheets

(30) Foreign Application Priority Data

Nov. 7, 2016 (JP) .................................. 2016-216983
Jan. 18, 2017 (JP) .................................. 2017-006700

(51) Int. Cl.

| | |
|---|---|
| *H04R 9/00* | (2006.01) |
| *H01F 27/29* | (2006.01) |
| *H05K 3/30* | (2006.01) |
| *B06B 1/04* | (2006.01) |
| *H05K 3/34* | (2006.01) |
| *H04R 9/04* | (2006.01) |
| *H01F 7/20* | (2006.01) |
| *H01F 27/28* | (2006.01) |
| *H01F 27/32* | (2006.01) |
| *H04R 7/00* | (2006.01) |
| *H05K 1/18* | (2006.01) |
| *H01F 7/06* | (2006.01) |

(52) U.S. Cl.
CPC ........... *H01F 27/29* (2013.01); *H01F 27/292* (2013.01); *H01F 27/323* (2013.01); *H01F 41/041* (2013.01); *H04R 7/00* (2013.01); *H04R 9/00* (2013.01); *H04R 9/046* (2013.01); *H05K 1/181* (2013.01); *H05K 3/305* (2013.01); *H05K 3/3436* (2013.01); *H01F 2007/068* (2013.01); *H01F 2017/004* (2013.01); *H01F 2027/2809* (2013.01); *H05K 2201/1003* (2013.01); *H05K 2201/10083* (2013.01); *H05K 2201/10992* (2013.01)

(58) Field of Classification Search
CPC .. H01F 27/29; H01F 27/323; H01F 2017/004; H01F 2007/068; H01F 2027/2809; B06B 1/04; H05K 1/181; H05K 2201/1003; H05K 2201/10083; H05K 3/305; H05K 3/3436; H05K 2201/10992; H04R 9/00; H04R 9/046; H04R 7/00
See application file for complete search history.

(56) References Cited

U.S. PATENT DOCUMENTS

| | | |
|---|---|---|
| 2015/0022307 A1 | 1/2015 | Yokoyama et al. |
| 2016/0049237 A1 | 2/2016 | Yosui |
| 2016/0055967 A1 | 2/2016 | Nishino et al. |

FOREIGN PATENT DOCUMENTS

| | | |
|---|---|---|
| JP | 09-289128 A | 11/1997 |
| JP | 10-247697 A | 9/1998 |
| JP | 11-68004 A | 3/1999 |
| JP | 2004-296860 A | 10/2004 |
| JP | 2006-109123 A | 4/2006 |
| WO | 2009/081865 A1 | 7/2009 |
| WO | 2013/171923 A1 | 11/2013 |
| WO | 2014/115433 A1 | 7/2014 |
| WO | 2015/005161 A1 | 1/2015 |
| WO | 2015/129601 A1 | 9/2015 |

(1)

(2)

(3)

ELECTRONIC COMPONENT, DIAPHRAGM, AND ELECTRONIC DEVICE

CROSS REFERENCE TO RELATED APPLICATIONS

This application claims the benefit of priority to Japanese Patent Application No. 2016-113494 filed on Jun. 7, 2016, Japanese Patent Application No. 2016-153421 filed on Aug. 4, 2016, Japanese Patent Application No. 2016-216983 filed on Nov. 7, 2016, and Japanese Patent Application No. 2017-006700 filed on Jan. 18, 2017 and is a Continuation Application of PCT Application No. PCT/JP2017/020188 filed on May 31, 2017. The entire contents of these applications are hereby incorporated herein by reference.

BACKGROUND OF THE INVENTION

1. Field of the Invention

The present invention relates to an electronic component, particularly to an electronic component in which a coil is provided on an insulating base material, a diaphragm including the electronic component, and an electronic device including the electronic component or the diaphragm.

2. Description of the Related Art

Various electronic components, in which the coil is formed on the insulating base material formed by laminating a plurality of insulating base material layers, are conventionally known. For example, WO2014/115433 discloses an electronic component including a winding axis in a laminating direction of a plurality of insulating base material layers, and a mounting electrode is formed only on a mounting surface of the insulating base material in the electronic component. The electronic component is mounted on a mounting substrate or the like.

However, in the electronic component having the above configuration, when a large mounting electrode is formed on the mounting surface, this mounting electrode may interfere with a magnetic flux passing through the coil. In order to prevent the interference of the magnetic flux passing through the coil, it is conceivable to reduce an area of the mounting electrode. However, when such a mounting electrode is bonded to a conductor pattern formed on the mounting substrate with a conductive bonding material, such as solder interposed therebetween, there is a risk that sufficient bonding strength to the mounting substrate cannot be secured because of the small area of the mounting electrode.

On the other hand, a method for bonding (fixing) the mounting surface other than the mounting electrode to the mounting substrate using an insulating bonding material, such as an underfill, is conceivable when the electronic component is mounted on the mounting substrate.

However, even in the above bonding method, because the bonding between the insulating base material and the insulating bonding material (or between the insulating base material and the mounting substrate) is the bonding of a dissimilar material, the sufficient bonding strength cannot be secured and a risk of dropping the electronic component from the mounting substrate is generated.

SUMMARY OF THE INVENTION

Preferred embodiments of the present invention provide electronic components in each of which the sufficient bonding strength to the mounting substrate is easily be secured in mounting the electronic component on the mounting substrate using the conductive bonding material and the insulating bonding material and electronic devices each including a mounting substrate on which the electronic component is mounted.

According to a preferred embodiment of the present invention, an electronic component includes an insulating base material including a first main surface on a mounting surface side, the insulating base material including a plurality of insulating base material layers that are laminated; a coil including a coil conductor provided on at least one of the plurality of insulating base material layers and including a winding axis in a laminating direction of the plurality of insulating base material layers; a mounting electrode provided on the first main surface and connected to the coil; a projection at least partially provided on an electrode non-forming portion of the first main surface, the electrode non-forming portion including no mounting electrode; and a recess or a through-hole provided in the electrode non-forming portion and disposed at a position including a coil opening of the coil when viewed from the laminating direction. The projection is provided along a shape of the coil conductor in planar view of the first main surface, the coil conductor is disposed across different positions in the laminating direction, and a portion of the coil conductor, which is positioned on an innermost peripheral side when viewed from a winding axis direction, is separated farther away from the first main surface in the laminating direction as compared to a portion located closest to the first main surface side.

With this configuration, the bonding strength between the insulating base material and the insulating bonding material is improved because a surface area of the bonding portion (a portion at which the insulating base material and the insulating bonding material contact each other) becomes larger as compared to the case in which the projection is not provided in a portion (the bonding portion) that is in contact with the insulating bonding material in the mounting state to the mounting substrate in the electrode non-forming portion. Therefore, the electronic component in which the sufficient bonding strength to the mounting substrate is secured is able to be provided with a simple structure.

With this configuration, as compared to the case in which the recess is not provided in the electrode non-forming portion, the surface area of the bonding portion is further enlarged, and the bonding strength between the insulating base material and the insulating bonding material is further improved.

In the case in which the electronic component is mounted on the mounting substrate, a gap between the inner peripheral portion of the first coil conductor and the conductor provided in the mounting substrate increases as compared to the case in which electronic components not having the above configuration are mounted on the mounting substrate. Thus, the increase in stray capacitance generated between the inner peripheral portion of the first coil conductor and the conductor provided on the mounting substrate is prevented even if the insulating bonding material having a dielectric constant higher than that of the insulating base material extends into the recess.

In an electronic component according to a preferred embodiment of the present invention, the plurality of insulating base material layers may be made of a thermoplastic resin.

In an electronic component according to a preferred embodiment of the present invention, preferably the coil conductor includes a plurality of coil conductors, and the plurality of coil conductors are provided on at least two insulating base material layers among the plurality of insulating base material layers. With this configuration, the electronic component including the coil including a predetermined number of windings and inductance is able to be provided.

In an electronic component according to a preferred embodiment of the present invention, preferably the plurality of insulating base material layers include a first insulating base material layer including the first main surface and a second insulating base material layer adjacent to the first insulating base material layer, and at least one of the plurality of coil conductors is disposed at an interface between the first insulating base material layer and the second insulating base material layer. The projection is easily provided as the coil conductor is disposed at a position closer to the first main surface in the insulating base material. Thus, with this configuration, the projection is easily provided on the first main surface of the insulating base material.

In an electronic component according to a preferred embodiment of the present invention, preferably the coil conductor includes a plurality of coil conductors, and the coil conductor disposed at the interface between the first insulating base material layer and the second insulating base material layer has a larger number of windings than other coil conductors. With this configuration, the number of turns is relatively large, the long projection is provided on the first main surface along the long coil conductor, and the surface area of the bonding portion is able to be further enlarged.

In an electronic component according to a preferred embodiment of the present invention, preferably at least portions of a plurality of the coil conductors overlap each other when viewed from the laminating direction of the plurality of insulating base material layers. The projection is easily provided as the coil conductors are densely disposed in the laminating direction of the plurality of insulating base material layers. Thus, with this configuration, the projection is able to be easily raised (the projection amount of the projection is able to be easily increased), and the surface area of the bonding portion is able to be further enlarged.

In an electronic component according to a preferred embodiment of the present invention, preferably the electronic component further includes a deformation preventing member provided on at least one of the first main surface and a second main surface opposite to the first main surface, the deformation preventing member having rigidity higher than that of the insulating base material. The insulating base material includes the second main surface. With this configuration, deformation on the mounting surface (first main surface) side due to an impact is prevented, and defective bonding between the insulating base material and the insulating bonding material is prevented.

In an electronic component according to a preferred embodiment of the present invention, an outer edge of a section in a direction orthogonal or substantially orthogonal to an extending direction of the coil conductor closest to the first main surface among the coil conductors may have an arc shape. The film thickness of the coil conductor is able to be easily increased by, for example, growing a plating film. Consequently, the projection is able to be easily provided along the coil conductor.

In an electronic component according to a preferred embodiment of the present invention, preferably the electronic component further includes a dummy conductor provided on the insulating base material. With this configuration, the shape and the position of the irregularities provided on the surface of the insulating base material are able to be controlled as needed.

According to another preferred embodiment of the present invention, a diaphragm includes a flexible support film including a routing conductor; and an electronic component fixed to the support film by a conductive bonding material and an insulating bonding material. The electronic component includes an insulating base material including a first main surface on a mounting surface side, the insulating base material including a plurality of insulating base material layers that are laminated; a coil including a coil conductor provided on at least one of the plurality of insulating base material layers and including a winding axis in a laminating direction of the plurality of insulating base material layers; a mounting electrode provided on the first main surface and connected to the coil; a projection provided on at least an electrode non-forming portion of the first main surface, the mounting electrode not being provided in the electrode non-forming portion; and a recess or a through-hole provided in the electrode non-forming portion and disposed at a position including a coil opening of the coil when viewed from the laminating direction. The projection is provided along the coil conductor in planar view of the first main surface, the coil conductor is disposed across different positions in the laminating direction, a portion of the coil conductor, which is positioned on an innermost peripheral side when viewed from a winding axis direction, is separated farther away from the first main surface in the laminating direction as compared to a portion located closest to the first main surface side, the mounting electrode is connected to the routing conductor of the support film with the conductive bonding material interposed therebetween, and in the first main surface, a bonding portion bonded to the support film with the insulating bonding material interposed therebetween includes the projection.

When the diaphragm vibrates, stress is generated at the interface between the insulating base material and the support film, and peeling easily occurs at the interface between the bonding portion of the insulating base material and the insulating bonding material. In this configuration, the projection is provided at the bonding portion, which is in contact with the insulating bonding material while being fixed (mounted) to the support film. Consequently, the surface area of the bonding portion (the portion at which the insulating base material and the insulating bonding material contact each other) increases as compared to the case in which the projection is not provided in the bonding portion, and the bonding strength between the insulating base material and the insulating bonding material is improved. Thus, with this configuration, the diaphragm in which the peeling of the interface between the insulating base material and the insulating bonding material is prevented is able to be provided.

According to another preferred embodiment of the present invention, an electronic device includes a mounting substrate; and an electronic component mounted on the mounting substrate using a conductive bonding material and an insulating bonding material. The electronic component includes an insulating base material including a first main surface on a mounting surface side, the insulating base material including a plurality of insulating base material layers that are laminated; a coil including a coil conductor provided on at least one of the plurality of insulating base material layers and including a winding axis in a laminating direction of the plurality of insulating base material layers; a mounting electrode provided on the first main surface and connected to the coil; a projection provided on at least an electrode non-forming portion of the first main surface, the mounting electrode not being not provided in the electrode non-forming portion; and a recess or a through-hole provided in the electrode non-forming portion and disposed at a position including a coil opening of the coil when viewed from the laminating direction, the projection is provided along the coil conductor in planar view of the first main surface, the coil conductor is disposed across different positions in the laminating direction, a portion of the coil conductor, which is positioned on an innermost peripheral side when viewed from a winding axis direction, is separated farther away from the first main surface in the laminating direction as compared to a portion located closest to the first main surface side, the mounting electrode is connected to the mounting substrate with the conductive bonding material interposed therebetween, and in the first main surface, a bonding portion bonded to the mounting substrate with the insulating bonding material interposed therebetween includes the projection.

With this configuration, the bonding strength between the insulating base material and the insulating bonding material is improved because a surface area of the bonding portion (a portion at which the insulating base material and the insulating bonding material contact each other) becomes larger as compared to the case in which the projection is not provided in the bonding portion that is in contact with the insulating bonding material in the mounting state to the mounting substrate in the electrode non-forming portion. For this reason, the electronic component in which the sufficient bonding strength to the mounting substrate is secured is able to be provided with a simple configuration, and the electronic device including the mounting substrate on which the electronic component is mounted is able to be provided.

With this configuration, as compared to the case in which the recess is not provided in the electrode non-forming portion, the surface area of the bonding portion is further enlarged, and the bonding strength between the insulating base material and the insulating bonding material is further improved.

With this configuration, a gap between the inner peripheral portion of the first coil conductor and the conductor provided in the mounting substrate increases as compared to the case in which electronic components not having the above-described configuration are mounted on the mounting substrate. Thus, the increase in stray capacitance generated between the inner peripheral portion of the first coil conductor and the conductor provided on the mounting substrate is prevented even if the insulating bonding material having a dielectric constant higher than that of the insulating base material intrudes into the recess.

In an electronic device according to a preferred embodiment of the present invention, preferably the electrode non-forming portion is the bonding portion. With this configuration, the surface area of the bonding portion is further enlarged as compared to the case in which the bonding portion is a portion of the electrode non-forming portion, so that the bonding strength between the insulating base material and the insulating bonding material is further improved.

In an electronic device according to a preferred embodiment of the present invention, the plurality of insulating base material layers may be made of a thermoplastic resin.

In an electronic device according to a preferred embodiment of the present invention, preferably the electronic device further includes a deformation preventing member provided on at least one of the first main surface and a second main surface opposite to the first main surface, the deformation preventing member having rigidity higher than that of the insulating base material. The insulating base material includes the second main surface. With this configuration, deformation on the mounting surface (first main surface) side due to an impact is prevented, and defective bonding between the insulating base material and the insulating bonding material is prevented.

In an electronic device according to a preferred embodiment of the present invention, preferably the electronic device further includes a deformation preventing member provided on at least one of the first main surface and a second main surface opposite to the first main surface, the deformation preventing member having a linear expansion coefficient between a linear expansion coefficient of the mounting substrate and a linear expansion coefficient of the insulating base material.

The insulating base material includes the second main surface. In the insulating base material in which the recess is provided, a warp easily occurs due to a difference in linear expansion coefficient between the electronic component and the mounting substrate by a temperature change in mounting the electronic component (for example, a reflow process). However, with this configuration, the occurrence of the warp due to the difference in linear expansion coefficient between the electronic component and the mounting substrate, caused by the temperature change during the mounting of the electronic component is able to be prevented.

In an electronic device according to a preferred embodiment of the present invention, an outer edge of a section in a direction orthogonal or substantially orthogonal to an extending direction of the coil conductor closest to the first main surface among the coil conductors may have an arc shape. The film thickness of the coil conductor is able to be easily increased by, for example, growing a plating film. Consequently, the projection is able to be easily provided along the coil conductor.

According to preferred embodiments of the present invention, electronic components in each of which the sufficient bonding strength to the mounting substrate is easily secured in mounting the electronic component on the mounting substrate using the conductive bonding material and the insulating bonding material and electronic devices each including the mounting substrate on which the electronic component is mounted are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
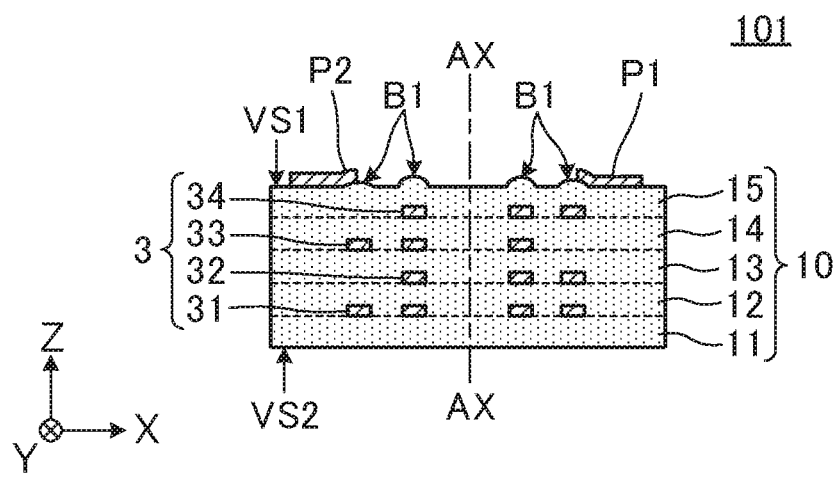
FIG. 1A is a sectional view of an electronic component 101 according to a first preferred embodiment of the present invention.

Hereinafter, a plurality of preferred embodiments will be described with reference to the drawings by describing several specific examples. In each drawing, an identical or similar component is denoted by an identical reference numeral. The preferred embodiments are separately illustrated in consideration of description of a main point or ease of understanding, but configurations of different preferred embodiments may partially be substituted or combined. In the second and subsequent preferred embodiments, the description of matters common to those of the first preferred embodiment are omitted, and only differences will be described. In particular, the same operations and advantageous effects with the same or similar configuration will not successively be described in each preferred embodiment.

First Preferred Embodiment

Figure 1B:
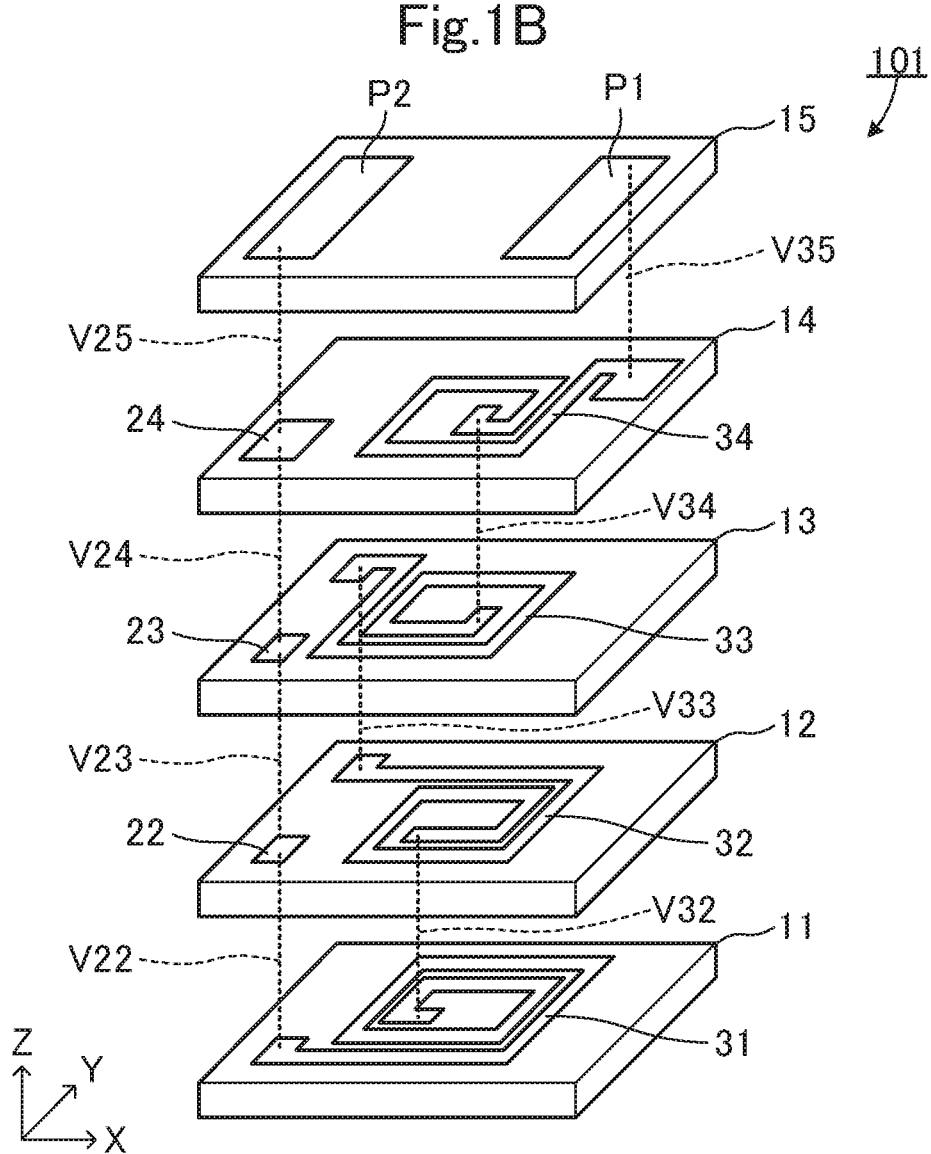
FIG. 1B is an exploded perspective view of the electronic component 101.
Figure 2A:
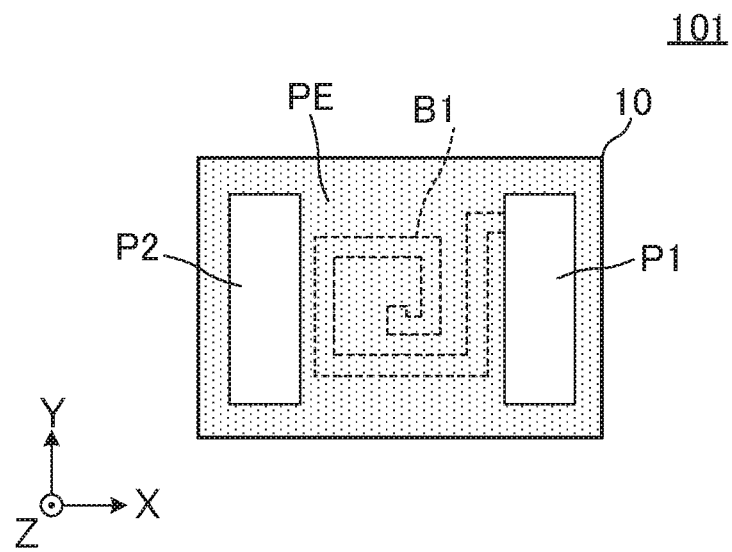
FIG. 2A is a plan view of the electronic component 101 and illustrates an electrode non-forming portion PE.
Figure 2B:
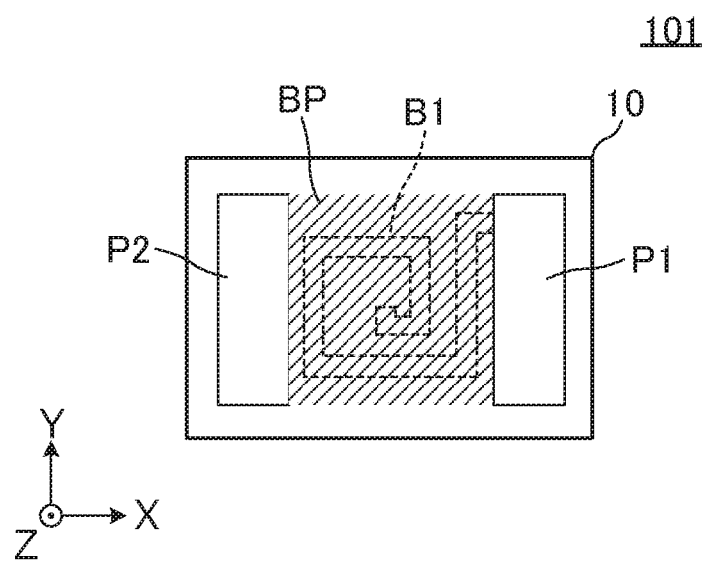
FIG. 2B is a plan view of the electronic component 101 and illustrates a bonding portion BP including a projection B1 of a first main surface VS1.

FIG. 1A is a sectional view of an electronic component 101 according to a first preferred embodiment, and FIG. 1B is an exploded perspective view of the electronic component 101. FIG. 2A is a plan view of the electronic component 101 and illustrates an electrode non-forming portion PE, and FIG. 2B is a plan view of the electronic component 101 and illustrates a bonding portion BP including a projection B1 of a first main surface VS1. In FIG. 1A, a thickness of each component is illustrated in an exaggerated manner. The same is true for sectional views in the following preferred embodiments. In FIG. 2A, the electrode non-forming portion PE is indicated by a dot pattern in order to easily understand the structure. In FIG. 2B, the bonding portion BP including the projection B1 of the first main surface VS1 is indicated by hatching.

The electronic component is an element mounted on a mounting substrate or other suitable substrate using a conductive bonding material and an insulating bonding material. The electronic device includes the electronic component, the mounting substrate, and other elements and components. For example, the electronic device may preferably be a cellular phone terminal, a smartphone, a tablet terminal, a notebook PC, a PDA, a wearable terminal (such as a smart watch or a smart glass), a camera, a game machine, a toy, and other suitable devices.

The electronic component 101 includes an insulating base material 10 including the first main surface VS1 and a second main surface VS2 opposite to the first main surface VS1, a coil 3 (to be described in detail later) provided on the insulating base material 10, mounting electrodes P1, P2 provided on the first main surface VS1, and the projection B1. In the present invention, the first main surface VS1 of the insulating base material 10 corresponds to the mounting surface and the second main surface VS2 corresponds to the top surface.

The insulating base material 10 preferably has, for example, a rectangular or substantially rectangular parallelepiped shape made of a thermoplastic resin in which a longitudinal direction is matched with an X-axis direction. As illustrated in FIG. 1B, the insulating base material 10 is formed by sequentially laminating a plurality of insulating base material layers 11, 12, 13, 14, 15 made of the thermoplastic resin. Each of the plurality of insulating base material layers 11, 12, 13, 14, 15 is preferably, for example, a flat plate having a rectangular or substantially rectangular planar shape, and the longitudinal direction is matched with the X-axis direction. For example, each of the plurality of insulating base material layers 11, 12, 13, 14, 15 are sheets mainly including a liquid crystal polymer.

A coil conductor 31 is provided on a surface of the insulating base material layer 11. The coil conductor 31 is preferably, for example, a rectangular or substantially rectangular spiral conductor including about 2 turns disposed near a center of the insulating base material layer 11. For example, the coil conductor 31 is preferably a conductor pattern made of a Cu foil.

A coil conductor 32 and a conductor 22 are provided on the surface of the insulating base material layer 12. The coil conductor 32 is a rectangular or substantially rectangular spiral conductor including about 1.5 turns disposed near the center of the insulating base material layer 12. The conductor 22 is a rectangular or substantially rectangular conductor disposed near a first corner (a lower left corner of the insulating base material layer 12 in FIG. 1B) of the insulating base material layer 12. For example, each of the coil conductor 32 and the conductor 22 is preferably a conductor pattern made of a Cu foil.

A coil conductor 33 and a conductor 23 are provided on the surface of the insulating base material layer 13. The coil conductor 33 is a rectangular or substantially rectangular spiral conductor including about 1.5 turns disposed near the center of the insulating base material layer 13. The conductor 23 is a rectangular or substantially rectangular conductor disposed near the first corner (the lower left corner of the insulating base material layer 13 in FIG. 1B) of the insulating base material layer 13. For example, each of the coil conductor 33 and the conductor 23 is preferably a conductor pattern made of a Cu foil.

A coil conductor 34 and a conductor 24 are provided on the surface of the insulating base material layer 14. The coil conductor 34 is a rectangular or substantially rectangular spiral conductor including about 1.5 turns disposed near the center of the insulating base material layer 14. The conductor 24 is a rectangular or substantially rectangular conductor disposed near the first corner (the lower left corner of the insulating base material layer 14 in FIG. 1B) of the insulating base material layer 14. For example, each of the coil conductor 34 and the conductor 24 is preferably a conductor pattern made of a Cu foil.

The two mounting electrodes P1, P2 are provided on the surface of the insulating base material layer 15. Each of the mounting electrodes P1, P2 is a rectangular or substantially rectangular conductor in which the longitudinal direction is matched with a Y-axis direction. The mounting electrodes P1, P2 of the first preferred embodiment are provided near a first side (a right side of the insulating base material layer 15 in FIG. 1B) of the insulating base material layer 15 and a second side (a left side of the insulating base material layer 15), respectively, and disposed along the X-axis direction. For example, each of the mounting electrodes P1, P2 is preferably a conductor pattern made of a Cu foil.

As illustrated in FIG. 1B, the mounting electrode P1 is connected to a first end of the coil conductor 34 through an interlayer connection conductor V35 formed in the insulating base material layer 15. A second end of the coil conductor 34 is connected to the first end of the coil conductor 33 through the interlayer connection conductor V34 formed in the insulating base material layer 14. The second end of the coil conductor 33 is connected to the first end of the coil conductor 32 through the interlayer connection conductor V33 formed in the insulating base material layer 13. The second end of the coil conductor 32 is connected to the first end of the coil conductor 31 through the interlayer connection conductor V32 formed in the insulating base material layer 12. The second end of the coil conductor 31 is connected to the mounting electrode P2 through the conductors 22, 23, 24 formed on the insulating base material layers 12, 13, 14 and interlayer connection conductors V22, V23, V24, V25.

In this way, the rectangular helical coil 3 of about 6 turns is formed in the electronic component 101 while the electronic component 101 includes the coil conductors 31, 32, 33, 34 formed on at least two of the insulating base material layers 11, 12, 13, 14, among the plurality of insulating base material layers 11, 12, 13, 14, 15 and the interlayer connection conductors V32, V33, V34. As illustrated in FIGS. 1A and 1B, the coil 3 is formed inside the insulating base material 10, and both ends of the coil 3 are connected to the mounting electrodes P1, P2. As illustrated in FIG. 1A, the coil 3 includes a winding axis AX in a laminating direction (Z-axis direction) of the plurality of insulating base material layers 11, 12, 13, 14, 15.

In the first preferred embodiment, by way of example, the coil 3 includes the winding axis AX in the laminating direction (Z-axis direction) of the plurality of insulating base material layers 11, 12, 13, 14, 15. However, the winding axis AX of the coil 3 is not exactly matched with the Z-axis direction. In various preferred embodiments of the present invention, the term "including a winding axis in a laminating direction of a plurality of insulating base material layers" means that, for example, the winding axis AX of the coil 3 ranges from about −30° to about +30° with respect to the Z-axis direction, for example.

As illustrated in FIG. 1A, at least portions of the plurality of coil conductors 31, 32, 33, 34 overlap each other when viewed from the Z-axis direction.

As illustrated in FIG. 1A, the projection B1 is provided on the first main surface VS1 of the insulating base material 10. The projection B1 is a convex portion of the insulating base material 10 provided on the first main surface VS1 by disposing the coil conductor inside the insulating base material 10, and is provided along a shape of the coil conductor in planar view of the first main surface VS1 (as viewed from the Z-axis direction). As illustrated in FIG. 2A, at least a portion of the projection B1 is provided in the electrode non-forming portion PE in which the mounting electrodes P1, P2 are not provided on the first main surface VS1. As described in detail later, the bonding portion BP in FIG. 2B is a portion of the first main surface VS1 (electrode non-forming portion PE) bonded to the mounting substrate with the insulating bonding material interposed therebetween, and is a portion including the projection B1.

Figure 3:
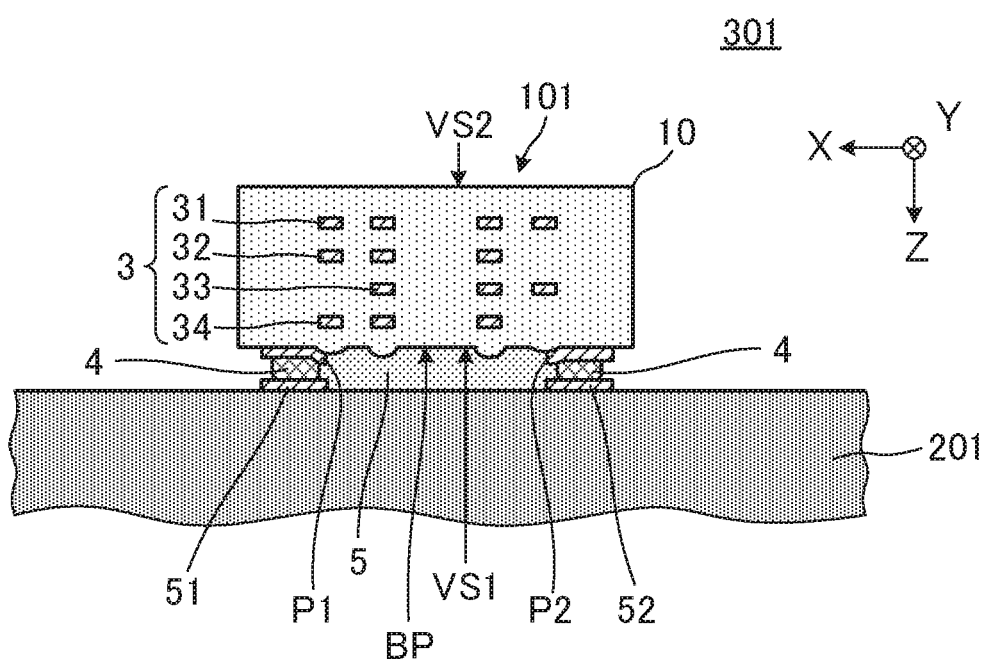
FIG. 3 is a sectional view illustrating a main portion of an electronic device 301 according to the first preferred embodiment of the present invention.

A state in which the electronic component 101 is mounted on the mounting substrate using the conductive bonding material and the insulating bonding material will be described below with reference to the drawing. FIG. 3 is a sectional view illustrating a main portion of an electronic device 301 of the first preferred embodiment.

The electronic device 301 includes the electronic component 101 and a mounting substrate 201. For example, the mounting substrate 201 is preferably, a printed wiring board.

Conductors 51, 52 are provided on a main surface of the mounting substrate 201. The conductors 51, 52 are connected to the mounting electrodes P1, P2, respectively with a conductive bonding material 4 interposed therebetween. The bonding portion BP in FIG. 2B is bonded to the mounting substrate 201 with an insulating bonding material 5 interposed therebetween. For example, the conductive bonding material 4 is preferably solder. The insulating bonding material 5 is a bonding agent that thermally cures at a temperature equal or nearly equal to a melting temperature of the conductive bonding material 4. For example, the insulating bonding material 5 is preferably a bonding agent made of an epoxy thermosetting resin. For example, the insulating bonding material 5 may preferably be an underfill.

According to the first preferred embodiment, the following advantageous effects are obtained.

In the electronic component 101 of the first preferred embodiment, the projection B1 is provided in the bonding portion BP that contacts with the insulating bonding material 5 while being mounted on the mounting substrate 201 in the first main surface VS1 (electrode non-forming portion PE). With this configuration, the bonding strength between the insulating base material 10 and the insulating bonding material 5 is improved because a surface area of the bonding portion BP (the portion at which the insulating base material 10 and the insulating bonding material 5 contact each other) becomes larger as compared to the case in which the projection B1 is not provided in the bonding portion BP. Consequently, the electronic component in which the sufficient bonding strength to the mounting substrate 201 is secured is able to be provided with a simple structure. Additionally, the electronic device including the mounting substrate on which the electronic component is mounted is able to be provided.

In the first preferred embodiment, the coil 3 includes the coil conductors 31, 32, 33, 34 that are provided on at least two of the insulating base material layers 11, 12, 13, 14, respectively among the plurality of insulating base material layers 11, 12, 13, 14, 15. With this configuration, the electronic component including the coil having a predetermined number of windings and inductance is provided.

In the first preferred embodiment, the coil conductor 34 (one of the plurality of coil conductors 31, 32, 33, 34) is disposed at an interface between the insulating base material layer 15 (first insulating base material layer) including the first main surface VS1 and the insulating base material layer 14 (second insulating base material layer) adjacent to the insulating base material layer 15. The projection B1 is easily provided as the coil conductor is disposed at a position closer to the first main surface VS1 in the insulating base material 10. Thus, with this configuration, the projection B1 having a large projection amount (high) on the first main surface VS1 of the insulating base material 10 is easily provided.

In the first preferred embodiment, at least portions of the plurality of coil conductors 31, 32, 33, 34 overlap each other when viewed from the Z-axis direction. The projection B1 is easily provided as the coil conductors are densely disposed in the Z-axis direction. Thus, with this configuration, the projection B1 is able to be easily raised (the projection amount of the projection B1 is able to be easily increased), and the surface area of the bonding portion BP (the portion at which the insulating base material 10 and the insulating bonding material 5 contact each other) is able to be further enlarged.

The high projection B1 (having the large projection amount) is easily provided on the first main surface VS1 as the number of overlapping coil conductors increase in the Z-axis direction. However, in the case in which the number of overlapping coil conductors in the Z-axis direction is equal or substantially equal, the high projection B1 is more easily provided when all of the coil conductors overlapping each other in the Z-axis direction are disposed at a position closer to the first main surface VS1 in the insulating base material 10. As described above, one of the plurality of coil conductors overlapping each other in the Z-axis direction is preferably disposed at the interface between the first insulating base material layer including the first main surface VS1 and the second insulating base material adjacent to the first insulating base material layer.

In the first preferred embodiment, the insulating bonding material 5 is the bonding agent that thermally cures at a temperature equal or nearly equal to the melting temperature of the conductive bonding material 4. With this configuration, a step of connecting the mounting electrodes P1, P2 to the conductors 51, 52, respectively with the conductive bonding material 4 interposed therebetween and a step of bonding the bonding portion BP to the mounting substrate 201 with the insulating bonding material 5 interposed therebetween are able to be concurrently performed by, for example, a reflow process. Thus, a step of mounting the electronic component on the mounting substrate is simplified.

Figure 4:
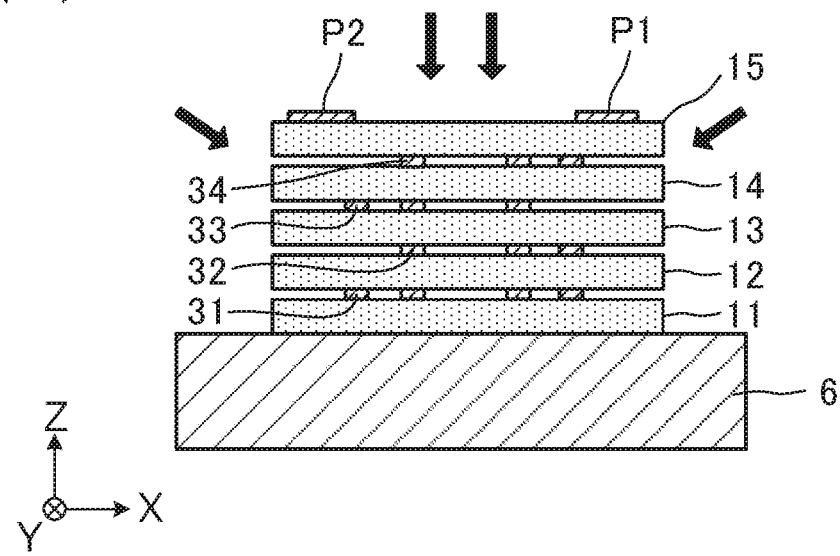
FIG. 4 is a sectional view sequentially illustrating a process of manufacturing the electronic component 101.
Figure 4:
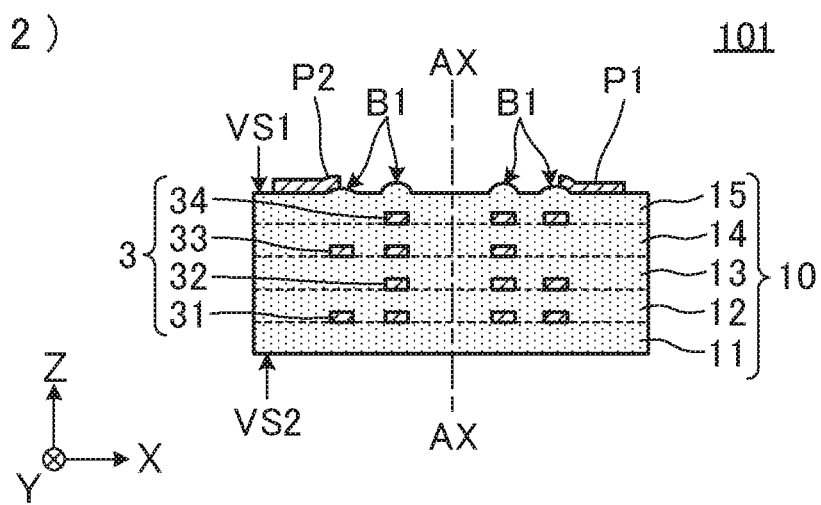

For example, the electronic component 101 of the first preferred embodiment is manufactured by the following non-limiting example of a process. FIG. 4 is a sectional view sequentially illustrating a process of manufacturing the electronic component 101. For convenience, only one element (piece) is illustrated in FIG. 4. However, the actual process of manufacturing the electronic component is performed in an aggregate substrate state.

As illustrated in a part (1) of FIG. 4, coil conductors 31, 32, 33, 34 are formed on a plurality of insulating base material layers 11, 12, 13, 14, respectively. Specifically, a metal foil (for example, Cu foil) is laminated on one main surface of the insulating base material layers 11, 12, 13, 14 in the aggregate substrate state, and the metal foil is patterned by photolithography to form the coil conductors 31, 32, 33, 34.

For example, each of the insulating base material layers 11, 12, 13, 14, 15 is preferably a thermoplastic resin sheet, such as a liquid crystal polymer. The step of forming the coil conductor in at least one insulating base material layer among the plurality of insulating base material layers is an example of the conductor forming step according to a preferred embodiment of the present invention.

The mounting electrodes P1, P2 are formed on the surface (the top surface of the insulating base material layer 15 in FIG. 4, the top surface defining the first main surface VS1 of the insulating base material 10) of the insulating base material layer 15. Consequently, the electrode non-formation portion PE in which the mounting electrodes P1, P2 are not formed is formed on the first main surface VS1 after the insulating base material 10 is formed. Specifically, the metal foil (for example, Cu foil) is laminated on one of the main surfaces of the insulating base material layer 15, and the metal foil is patterned by photolithography to form the mounting electrodes P1, P2.

The step of forming the electrode non-forming portion at which the mounting electrode is not formed on the first main surface of the insulating base material while forming the mounting electrode on the first main surface is an example of the electrode forming step according to a preferred embodiment of the present invention. In the electrode forming step of the first preferred embodiment, the mounting electrodes P1, P2 are formed on the surface of the insulating base material layer 15 defining the first main surface VS1 of the insulating base material 10 before the base material forming step.

Other conductors (conductors 22, 23, 24 in FIG. 1B) and the interlayer connection conductors (the interlayer connection conductor V22, V23, V24, V25, V32, V33, V34, V35 in FIG. 1B) are formed in the plurality of insulating base material layers 11, 12, 13, 14, 15. After a through-hole is formed by laser or other suitable method, a conductive paste including at least one of Cu, Ag, Sn, Ni, Mo, other suitable material or an alloy thereof is disposed, and cured by heating and pressurization (the base material forming step of a preferred embodiment of the present invention), thus providing the interlayer connection conductor. For this reason, the interlayer connection conductor is made of a material having a melting point (melting temperature) lower than a temperature during the heating and pressurization.

Then, the insulating base material layers 11, 12, 13, 14, 15 are sequentially laminated on a high-rigidity base 6, and the plurality of laminated insulating base material layers 11, 12, 13, 14, 15 are heated and pressurized to form the insulating base material 10. Specifically, the plurality of laminated insulating base material layers are heated, and isostatically pressed (pressurized) by hydrostatic pressure from a direction of an arrow in a part (1) of FIG. 4. At this point, on the first main surface VS1 of the insulating base material 10, the projection B1 is formed along the shape of the coil conductor when viewed from the Z-axis direction. On the other hand, the projection B1 is hardly formed on the second main surface VS2 because the side of the second main surface VS2 is pressed against the base 6 during heating and pressurizing of the plurality of laminated insulating base material layers 11, 12, 13, 14, 15.

After the conductor forming step, the step of forming the insulating base material by heating and pressurizing the plurality of laminated insulating base material layers and of forming the projection along the shape of the coil conductor when the projection is viewed from the laminating direction of the plurality of insulating base material layers is an example of the base material forming step in a preferred embodiment of the present invention.

After the above-described process, the electronic component 101 in a part (2) of FIG. 4 is obtained by separating the aggregate substrate into individual pieces.

The electronic component in which the sufficient bonding strength to the mounting substrate is secured when mounting the electronic component on the mounting substrate using the conductive bonding material and the insulating bonding material is easily manufactured by the above-described manufacturing method.

In the first preferred embodiment, by way of example, the electrode forming step is performed before the base material forming step. However, the present invention is not limited to this process. The electrode forming step may be performed after the base material forming step. That is, in the electrode forming step, the mounting electrodes P1, P2 may be formed on the first main surface VS1 of the insulating base material 10 after the base material forming step.

Figure 5:
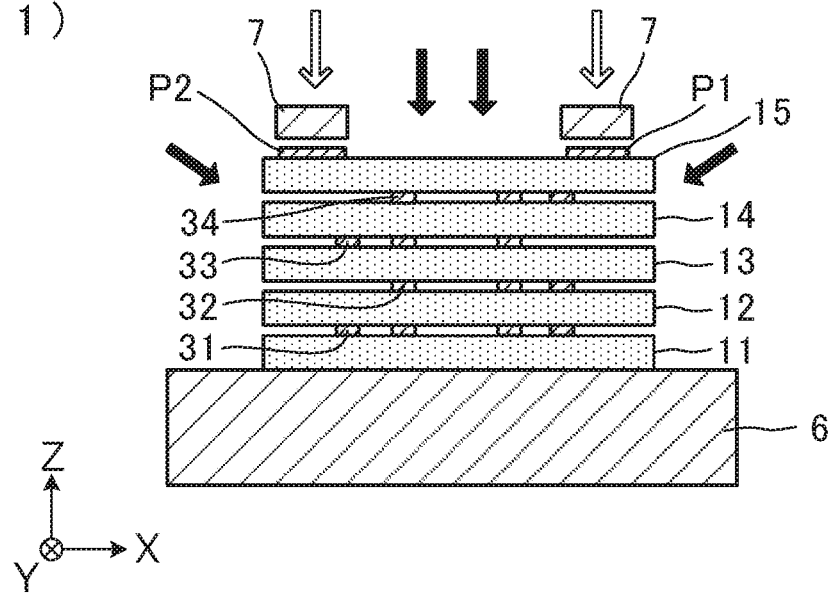
FIG. 5 is a sectional view illustrating a process of manufacturing an electronic component 101A, the process being different from the manufacturing process in FIG. 4.
Figure 5:
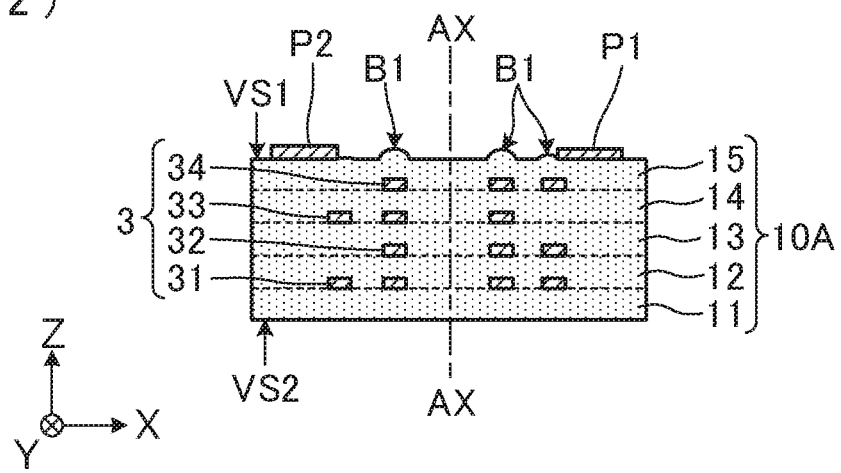

For example, the electronic component may be manufactured by the following non-limiting example of a process. FIG. 5 is a sectional view illustrating a process of manufacturing an electronic component 101A, the process being different from the manufacturing process in FIG. 4. For convenience, only one element (piece) portion is illustrated in FIG. 5.

The process of manufacturing the electronic component 101A in FIG. 5 differs from the process of manufacturing the electronic component 101 in FIG. 4 in that a high-rigidity member 7 is pressed against the first principal surface side during the substrate forming process. A portion of the process that is different from the process of manufacturing the electronic component 101 in FIG. 4 will be described below.

After the conductor forming step and the electrode forming step, as illustrated in a part (1) of FIG. 5, the insulating base material layers 11, 12, 13, 14, 15 are sequentially laminated on the high-rigidity base 6, and the plurality of laminated insulating base material layers 11, 12, 13, 14, 15 are heated and pressurized to form an insulating base material 10A. Specifically, the plurality of laminated insulating base material layers are heated, and a portion of the first main surface VS1 of the insulating base material 10A (on the mounting electrodes P1, P2) is pressed (pressurized) by a high-rigidity member 7 from the direction of an outlined arrow in the part (1) of FIG. 5. At the same time, a portion that is not pressurized by the member 7 is subjected to isotropic pressing (pressurization) by hydrostatic pressure from a direction of an arrow in the part (1) of FIG. 5. At this point, the projection B1 is hardly formed because a portion of the insulating base material 10A (on the mounting electrodes P1, P2) is pressurized by the member 7. On the other hand, in the portion that is not pressurized by the member 7, the projection B1 is formed along the shape of the coil conductor when viewed from the Z-axis direction. For example, the member 7 is preferably a flat metal plate.

After the above-described process, the electronic component 101A as shown in a part (2) of FIG. 5 is obtained by separating the aggregate substrate into individual pieces.

In this manner, in the case that a portion at which the projection B1 is not desired to be formed exists on the side of the first main surface VS1 of the insulating base material 10A, the heating and pressurization are performed while the high-rigidity member is brought into contact with the portion, which allows the construction of the electronic component 101A in which irregularities of a portion of the surface VS1 is prevented.

Second Preferred Embodiment

An example in which the entire electrode non-forming portion is bonded to the mounting substrate with the insulating bonding material interposed therebetween will be described in a second preferred embodiment of the present invention.

Figure 6A:
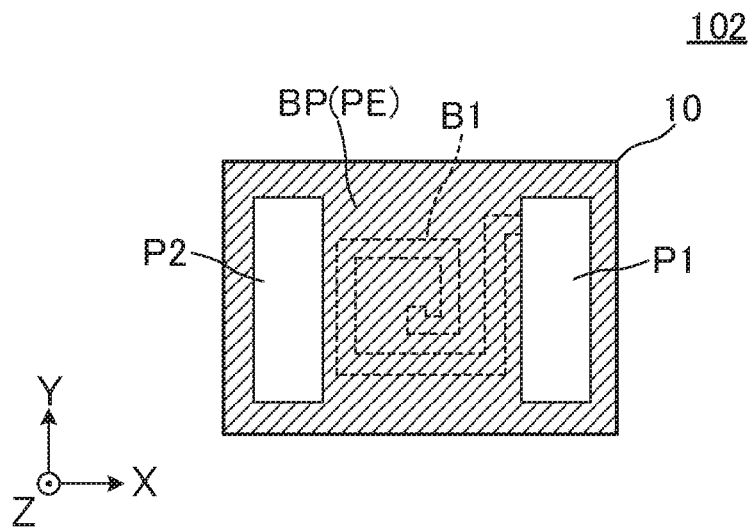
FIG. 6A is a plan view of an electronic component 102 according to a second preferred embodiment of the present invention and illustrates the bonding portion BP including the projection B1 of the first main face VS1.
Figure 6B:
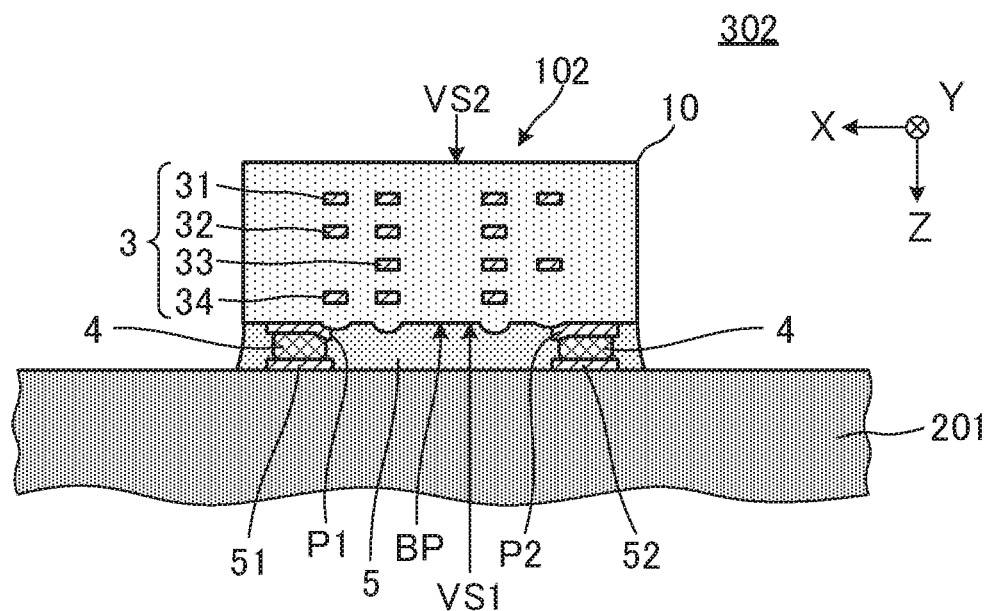
FIG. 6B is a sectional view illustrating a main portion of an electronic device 302 according to the second preferred embodiment of the present invention.

FIG. 6A is a plan view of an electronic component 102 according to the second preferred embodiment of the present invention and illustrates the bonding portion BP, and FIG. 6B is a sectional view illustrating a main portion of an electronic device 302 of the second preferred embodiment. In FIG. 6A, the bonding portion BP is indicated by hatching in order to easily understand the structure.

The electronic component 102 differs from the electronic component 101 of the first preferred embodiment in that the bonding portion BP is the entire electrode non-forming portion PE. In other words, the bonding portion BP and the electrode non-forming portion PE are matched with each other. Other configurations are identical or substantially identical to those of the electronic component 101.

The electronic device 302 includes the electronic component 102 and a mounting substrate 201. The conductors 51, 52 provided on the main surface of the mounting substrate 201 are connected to the mounting electrodes P1, P2 with the conductive bonding material 4 interposed therebetween, respectively. The bonding portion BP (the entire electrode non-forming portion PE) in FIG. 6A is bonded to the mounting substrate 201 with the insulating bonding material 5 interposed therebetween.

In the second preferred embodiment, the bonding portion BP is the entire electrode non-forming portion PE. With this configuration, as compared to the case in which the bonding portion BP is a portion of the electrode non-forming portion PE (see the first preferred embodiment), the surface area of the bonding portion BP (the portion at which the insulating base material 10 and the insulating bonding material 5 contact each other) increases, so that the bonding strength between the insulating base material 10 and the insulating bonding material 5 is further improved.

Third Preferred Embodiment

An example in which a portion of a coil is provided on the surface of the insulating base material is illustrated in a third preferred embodiment of the present invention.

Figure 7A:
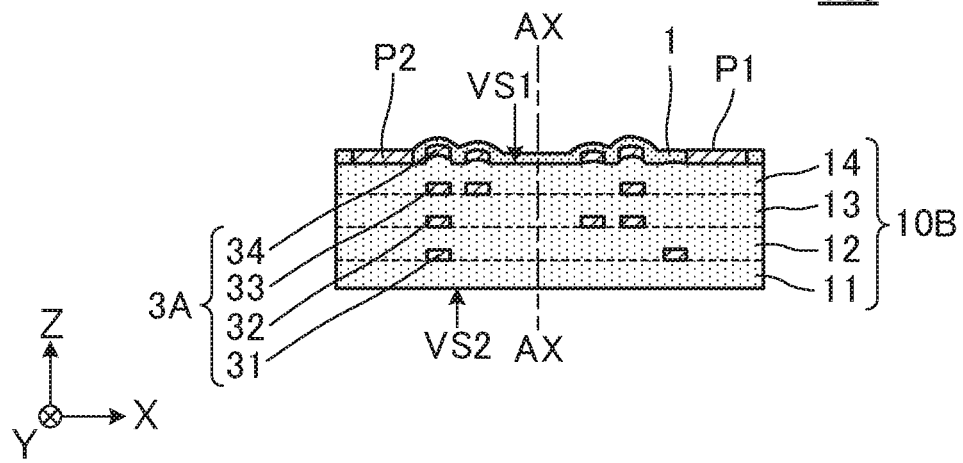
FIG. 7A is a sectional view of an electronic component 103 according to a third preferred embodiment of the present invention.
Figure 7B:
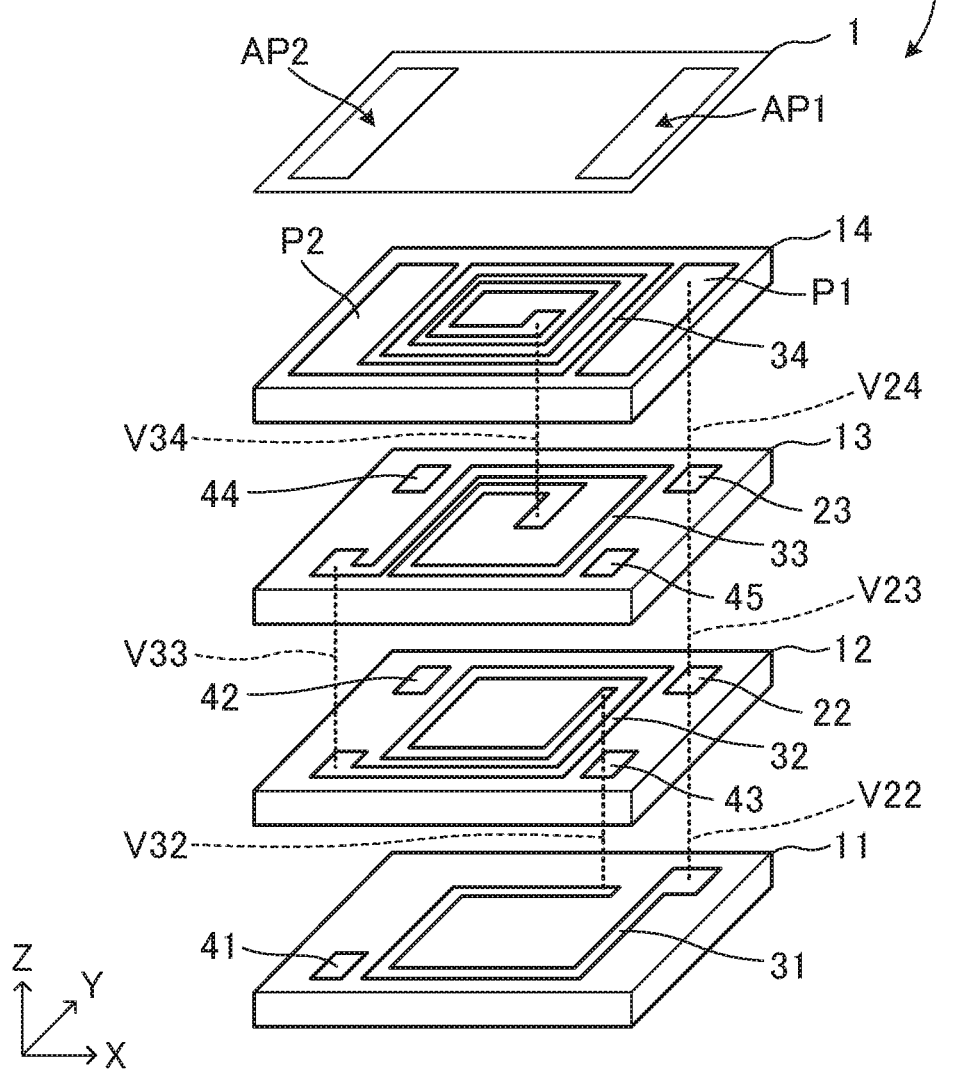
FIG. 7B is an exploded perspective view of the electronic component 103.

FIG. 7A is a sectional view of an electronic component 103 of the third preferred embodiment, and FIG. 7B is an exploded perspective view of the electronic component 103.

The electronic component 103 includes an insulating base material 10B including the first main surface VS1 and the second main surface VS2 opposite to the first main surface VS1, a coil 3A (to be described in detail later), the mounting electrodes P1, P2 provided on the first main surface VS1, the projection B1, and a protective layer 1.

The insulating base material 10B has a rectangular or substantially rectangular parallelepiped shape preferably made of a thermoplastic resin, for example, in which a longitudinal direction is matched with the X-axis direction. As illustrated in FIG. 7B, the insulating base material 10B is formed by sequentially laminating the plurality of insulating base material layers 11, 12, 13, 14 made of the thermoplastic resin. The configurations of the plurality of insulating base material layers 11, 12, 13, 14 are identical or substantially identical to those of the first preferred embodiment.

The coil conductor 31 and a dummy conductor 41 are provided on the surface of the insulating base material layer 11. The coil conductor 31 is a rectangular or substantially rectangular spiral conductor including more than about 1 turn disposed near the center of the insulating base material layer 11. The dummy conductor 41 is a rectangular or substantially rectangular conductor disposed near the first corner (the lower left corner of the insulating base material layer 11 in FIG. 7B) of the insulating base material layer 11. For example, the dummy conductor 41 is preferably a conductor pattern made of a Cu foil.

The coil conductor 32, the conductor 22, and dummy conductors 42, 43 are provided on the surface of the insulating base material layer 12. The coil conductor 32 is a rectangular or substantially rectangular spiral conductor including about 1.5 turns disposed near the center of the insulating base material layer 12. The conductor 22 is a rectangular or substantially rectangular conductor disposed near a third corner (an upper right corner of the insulating base material layer 12 in FIG. 7B) of the insulating base material layer 12. The dummy conductor 42 is a rectangular or substantially rectangular conductor disposed near a second corner (an upper left corner of the insulating base material layer 12) of the insulating base material layer 12. The dummy conductor 43 is a rectangular or substantially rectangular conductor disposed near a fourth corner (a lower right corner of the insulating base material layer 12) of the insulating base material layer 12. For example, each of the dummy conductors 42, 43 is preferably a conductor pattern made of a Cu foil.

The coil conductor 33, the conductor 23, and dummy conductors 44, 45 are provided on the surface of the insulating base material layer 13. The coil conductor 33 is a rectangular or substantially rectangular spiral conductor including about 1.5 turns disposed near the center of the insulating base material layer 13. The conductor 23 is a rectangular or substantially rectangular conductor disposed near the third corner (the upper right corner of the insulating base material layer 13 in FIG. 7B) of the insulating base material layer 13. The dummy conductor 44 is a rectangular or substantially rectangular conductor disposed near the second corner (the upper left corner of the insulating base material layer 13) of the insulating base material layer 13. The dummy conductor 45 is a rectangular or substantially rectangular conductor disposed near the fourth corner (the lower right corner of the insulating base material layer 13) of the insulating base material layer 13. For example, each of the dummy conductors 44, 45 is preferably a conductive pattern made of a Cu foil.

The coil conductor 34 and the two mounting electrodes P1, P2 are provided on the surface of the insulating base material layer 14. The coil conductor 34 is a rectangular or substantially rectangular spiral conductor of more than about 2 turns disposed near the center of the insulating base material layer 14. The mounting electrodes P1, P2 are disposed near the first side (the right side of the insulating base material layer 14 in FIG. 7B) of the insulating base material layer 14 and near the second side (the left side of the insulating base material layer 14), respectively, and disposed along the X-axis direction.

The protective layer 1 is preferably a resin film, for example, that is provided on the entire or substantially the entire surface of the first main surface VS1 of the insulating base material 10B to cover the coil conductor 34 provided on the first main surface VS1. The protective layer 1 includes openings AP1, AP2 at positions corresponding to the mounting electrodes P1, P2. Consequently, the protective layer 1 is provided on the top surface of the insulating base material layer 14, such that the mounting electrodes P1, P2 are exposed from the first main surface VS1. For example, the protective layer 1 is preferably a solder resist film. The protective layer 1 is not necessarily provided.

In the case in which the protective layer 1 is provided on the entire or substantially the entire first main surface VS1 of the insulating base material 10B as in the third preferred embodiment, the bonding portion (BP) is the surface (the top surface of the layer 1 in FIG. 7A) of the protective layer 1.

As illustrated in FIG. 7B, the mounting electrode P1 is connected to the first end of the coil conductor 31 through the conductors 22, 23 and the interlayer connection conductors V22, V23, V24, which are provided in the insulating base material layers 12, 13, 14. The second end of the coil conductor 31 is connected to the first end of the coil conductor 32 through the interlayer connection conductor V32 provided in the insulating base material layer 12. The second end of the coil conductor 32 is connected to the first end of the coil conductor 33 through the interlayer connection conductor V33 provided in the insulating base material layer 13. The second end of the coil conductor 33 is connected to the first end of the coil conductor 34 through the interlayer connection conductor V34 provided in the insulating base material layer 14. The second end of the coil conductor 34 is connected to the mounting electrode P2.

As described above, the rectangular or substantially rectangular helical coil 3A including about 6.5 turns is provided in the electronic component 103 while the electronic component 103 includes the coil conductors 31, 32, 33, 34 provided on the plurality of insulating base material layers 11, 12, 13, 14, respectively, and the interlayer connection conductors V32, V33, V34. As illustrated in FIG. 7A, a portion (coil conductor 34) of the coil 3A is provided on the first main surface VS1 (front surface) of the insulating base material 10A.

As illustrated in FIGS. 7A and 7B, the coil conductor 33 disposed at the interface between the insulating base material layer 14 (first insulating base material layer) including the first main surface VS1 and the insulating base material layer 13 (second insulating base material layer) adjacent to the insulating base material layer 14 is larger than other coil conductors 31, 32 in the number of windings.

According to the electronic component 103 of the third preferred embodiment, the following advantageous effects are obtained in addition to the advantageous effects of the first preferred embodiment.

In the third preferred embodiment, the coil conductor 33 disposed at the interface between the insulating base material layer 14 (first insulating base material layer) including the first main surface VS1 and the insulating base material layer 13 (second insulating base material layer) adjacent to the insulating base material layer 14 is larger than other coil conductors 31, 32 in the number of windings. The projection B1 is easily provided as the coil conductor is disposed at a position closer to the first main surface VS1 in the insulating base material 10B. Thus, with this configuration, a number of windings is relatively large, and the projection B1 is provided on the first main surface VS1 along the long coil conductor 33, and the surface area of the bonding portion (portion in which the insulating base material 10B and the insulating bonding material 5 contact with each other) is able to be further enlarged.

In the third preferred embodiment, the dummy conductors 41, 42, 43, 44, 45 provided in the insulating base material 10B are provided. The shape and the position of the irregularities provided on the surface of the insulating base material 10B are able to be controlled by providing the dummy conductor in the insulating base material. In this manner, the dummy conductor may be provided as necessary for the purpose of improving stability during mounting on the mounting substrate and of controlling a flow of the insulating bonding material (underfill).

As described in the third preferred embodiment, a portion of the coil (coil conductor) may be provided on the first main surface VS1 (outermost layer) of the insulating base material. In this case, in order to prevent a short circuit, the protective layer (resist) is preferably provided on the outermost layer of the insulating base material on which a portion of the coil is provided. A portion of the coil may be provided on the second main surface of the insulating base material.

Fourth Preferred Embodiment

An example in which a recess is provided on the first main surface side of the insulating base material will be described in a fourth preferred embodiment of the present invention.

Figure 8A:
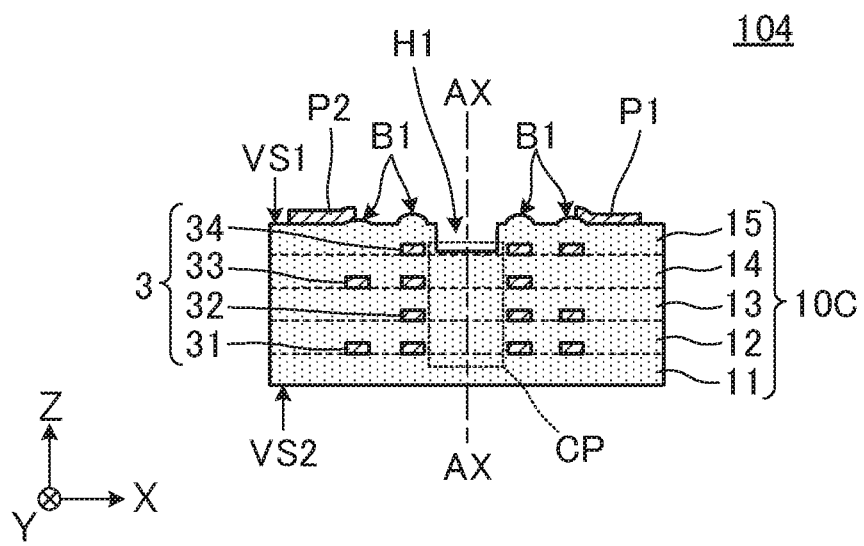
FIG. 8A is a sectional view of an electronic component 104 according to a fourth preferred embodiment.
Figure 8B:
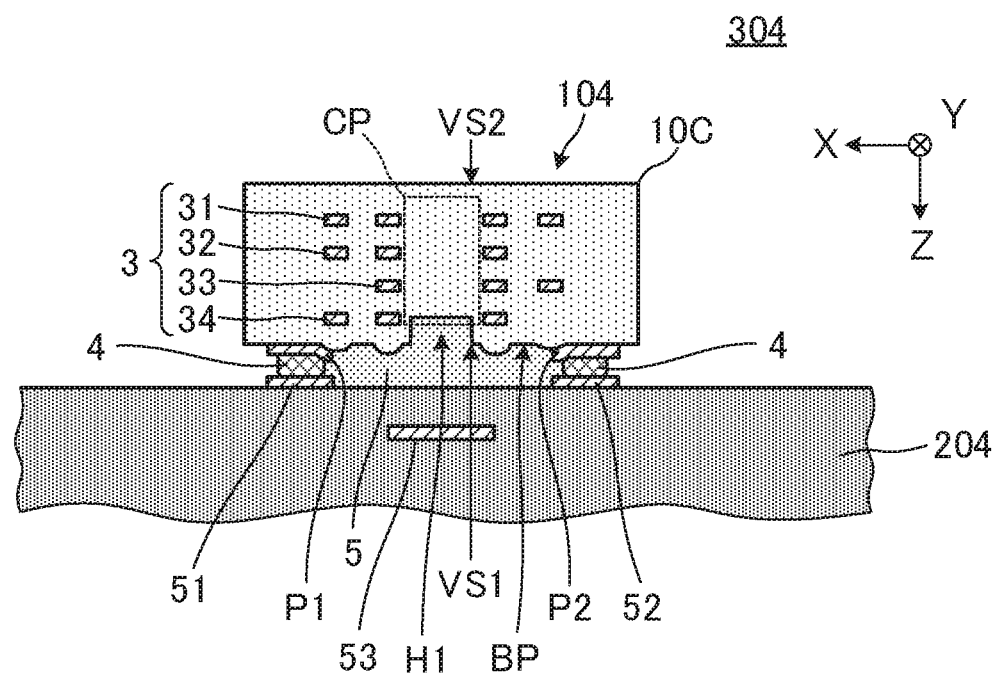
FIG. 8B is a sectional view illustrating a main portion of an electronic device 304 according to the fourth preferred embodiment of the present invention.

FIG. 8A is a sectional view of an electronic component 104 according to the fourth preferred embodiment, and FIG. 8B is a sectional view illustrating a main portion of an electronic device 304 according to the fourth preferred embodiment.

The electronic component 104 includes an insulating base material 10C, the coil 3, the mounting electrodes P1, P2, and the projection B1. The configuration of the electronic component 104 is identical or substantially identical to that of the electronic component 101 of the first preferred embodiment, except that the insulating base material 10C includes a recess H1 provided on the side of the first main surface VS1, unlike the insulating base material 10 of the first preferred embodiment.

The recess H1 is an opening that is provided from the first main surface VS1 toward the inside (−Z direction) of the insulating base material 10C in the electrode non-forming portion (see the electrode non-forming portion PE in FIG. 6A). The recess H1 is disposed in a coil opening CP of the coil 3 when viewed from the laminating direction (Z-axis direction). For example, the recess H1 is formed by performing laser etching from the first main surface side after the insulating base material is provided. The insulating substrate 10C of the fourth preferred embodiment preferably has a thickness of about 200 μm, for example, in the laminating direction, a depth of the recess H1 preferably ranges, for example, from about 30 μm to about 40 82 m, and a height of the projection B1 preferably ranges, for example, from about 10 μm to about 20 μm.

The electronic device 304 includes the electronic component 104 and a mounting substrate 204. Conductors 51, 52 are provided on the main surface of the mounting substrate 204, and a conductor 53 is provided in the mounting substrate 204. The conductors 51, 52 are connected to the mounting electrodes P1, P2, respectively with a conductive bonding material 4 interposed therebetween. The bonding portion BP of the electronic component 104 includes an inner surface of the recess H1. Thus, as illustrated in FIG. 8B, the insulating bonding material 5 intrudes into the recess H1 by connecting the bonding portion BP to the mounting substrate 204 with the insulating bonding material 5 interposed therebetween, and the entire inner surface of the recess H1 contacts with the insulating bonding material 5.

With this configuration, as compared to the case in which the recess H1 is not provided in the electrode non-forming portion (see the second preferred embodiment), the surface area of the bonding portion BP is further enlarged, and the bonding strength between the insulating base material 10C and the insulating bonding material 5 is further improved.

Among the spiral coil conductors exceeding 1 turn, an inner peripheral portion (1-turn portion located at an innermost periphery of the coil conductor) has a smaller line length and a smaller conductor area as compared to an outer peripheral portion (1-turn portion located at an outermost periphery of the coil conductor). In the fourth preferred embodiment, the recess H1 is disposed in the coil opening CP of the coil 3 when viewed from the Z-axis direction. With this configuration, an increase in stray capacitance generated between the outer peripheral portion of the coil conductor 34 having a large conductor area and the conductor 53 is prevented even if the insulating bonding material 5 having a higher dielectric constant than that of the insulating base material 10C intrudes into the recess H1 in the case in which the electronic component 104 is mounted on the mounting substrate 204. Thus, with this configuration, a fluctuation in stray capacitance generated between the conductor 53 provided in the mounting substrate 204 and the coil 3 is relatively small when the electronic component in which the recess H1 is provided is mounted on the mounting substrate.

In the fourth preferred embodiment, the electronic component 104 includes the recess H1 provided from the first main surface VS1 toward the inside (−Z direction) of the insulating base material 10C. However, the electronic component 104 may include a through-hole extending to the second main surface VS2 from the first main surface VS1. However, when the electronic component including the through-hole is mounted on the mounting substrate, there may be cases in which the insulating bonding material 5 does not intrude well into the through-hole, or the insulating bonding material 5 is flows out from the through-hole. Thus, the electronic component including the recess H1 of the fourth preferred embodiment is more preferable than the electronic component including the through-hole.

Fifth Preferred Embodiment

An example of an electronic component in which a deformation preventing member is provided on the first main surface and the second main surface of the insulating base material will be described in a fifth preferred embodiment of the present invention.

Figure 9:
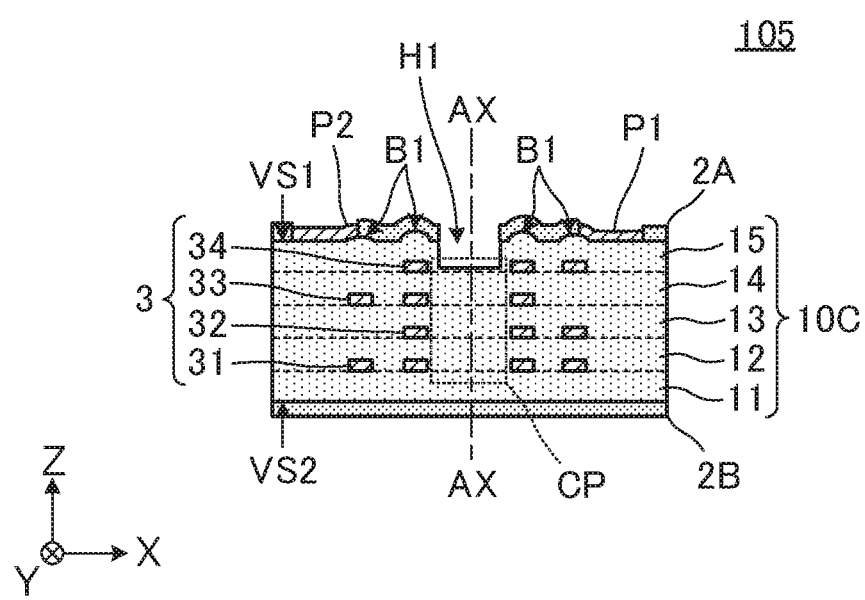
FIG. 9 is a sectional view of an electronic component 105 according to a fifth preferred embodiment of the present invention.

FIG. 9 is a sectional view of an electronic component 105 according to the fifth preferred embodiment.

The electronic component 105 includes the insulating base material 10C, the coil 3, the mounting electrodes P1, P2, the projection B1, and deformation preventing members 2A, 2B. In the electronic component 105 differs from the electronic component 104 of the fourth preferred embodiment in that the deformation preventing member 2A is provided on the first main surface VS1 of the insulating base material 10C, and that the deformation preventing member 2B is provided on the second main surface VS2. Other configurations are identical or substantially identical to those of the electronic component 104.

The deformation preventing members 2A, 2B have a linear expansion coefficient between a linear expansion coefficient of the mounting substrate (see the mounting substrate 204 in FIG. 8B) on which the electronic component 105 is mounted and a linear expansion coefficient of the insulating base material 10C. The deformation preventing members 2A, 2B have rigidity higher than that of the insulating base material 10C. The deformation preventing member 2A is provided on a portion of the first main surface VS1 of the insulating base material 10C excluding the mounting electrodes P1, P2 and the recess H1. The deformation preventing member 2B is provided on the entire or substantially the entire surface of the second main surface VS2 of the insulating base material 10C. The deformation preventing members 2A, 2B are preferably epoxy resin having a predetermined linear expansion coefficient by, for example, adjusting a filler amount. For example, after the insulating base material is provided, the epoxy resin is applied onto the entire or substantially the entire surfaces of the first main surface VS1 and the second main surface VS2 and patterned by photolithography, thus providing the deformation preventing members 2A, 2B.

In the case in which the deformation preventing member 2A is provided on the first main surface VS1 of the insulating base material 10C as in the fifth preferred embodiment, the bonding portion (BP) is the surface of the deformation preventing member 2A (the top surface of the deformation preventing member 2A in FIG. 9).

In the insulating base material 10C in which the recess H1 is provided, a warp easily occurs due to a difference in linear expansion coefficient between the electronic component and the mounting substrate on which the electronic component is mounted by a temperature change during the mounting of the electronic component (for example, a reflow process). However, in the fifth preferred embodiment, the deformation preventing members 2A, 2B having the linear expansion coefficient between the linear expansion coefficient of the mounting substrate on which the electronic component is mounted and the linear expansion coefficient of the insulating base material 10C are provided on the main surface VS1 and the second main surface VS2 of the insulating base material 10C. Consequently, the occurrence of the warp due to the difference in linear expansion coefficient between the electronic component and the mounting substrate on which the electronic component is mounted, caused by the temperature change during the mounting of the electronic component is able to be prevented. Additionally, in the fifth preferred embodiment, the deformation preventing members 2A, 2B having the rigidity higher than that of the material defining the insulating base material 10C are provided on the first main surface VS1 and the second main surface VS2 of the insulating base material 10C. With this configuration, deformation on the mounting surface (first main surface VS1) side due to an impact or other force is prevented, and defective bonding between the insulating base material 10C and the insulating bonding material is prevented.

The electronic component 105 in which the deformation preventing members 2A, 2B are provided on both the first main surface VS1 and the second main surface VS2 of the insulating base material 10C is described in the fifth preferred embodiment. However, the present invention is not limited to this configuration. The deformation preventing member may be provided on at least one of the first main surface VS1 and the second main surface VS2 of the insulating base material. The deformation preventing member may be partially provided on the first main surface VS1 and the second main surface VS2 of the insulating base material. However, the deformation preventing member is preferably provided on entire or substantially entire surfaces of the first main surface VS1 and the second main surface VS2.

Sixth Preferred Embodiment

An example in which the shape of the coil is different from other preferred embodiments will be described in a sixth preferred embodiment of the present invention.

Figure 10A:
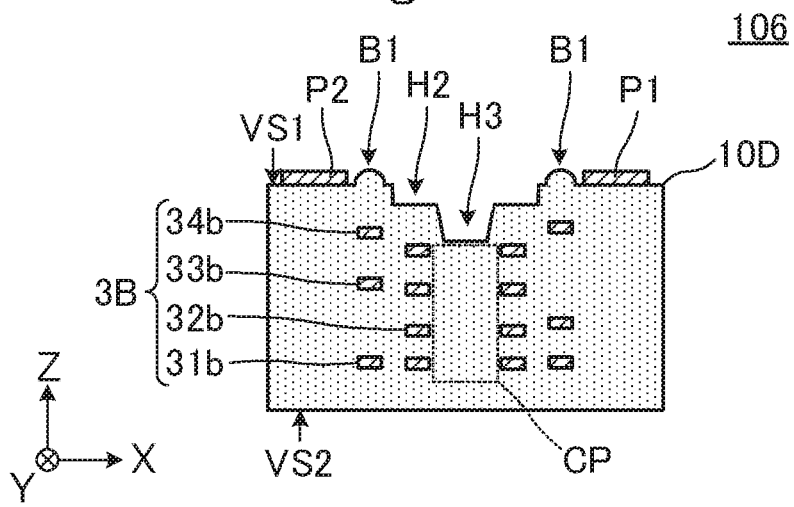
FIG. 10A is a sectional view of an electronic component 106 according to a sixth preferred embodiment of the present invention.
Figure 10B:
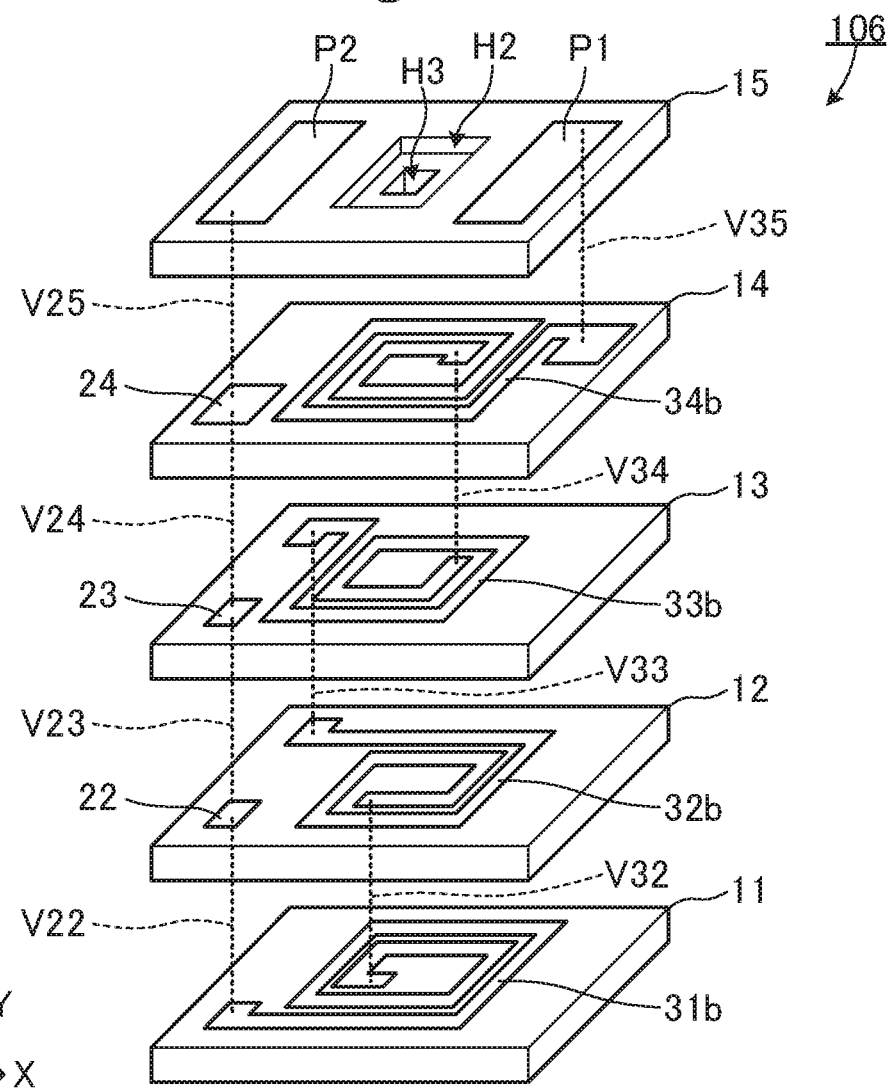
FIG. 10B is an exploded perspective view of the electronic component 106.

FIG. 10A is a sectional view of an electronic component 106 according to the sixth preferred embodiment, and FIG. 10B is an exploded perspective view of the electronic component 106.

The electronic component 106 includes an insulating base material 10D including the first main surface VS1 and the second main surface VS2 opposite to the first main surface VS1, a coil 3B (to be described in detail later) provided on the insulating base material 10D, the mounting electrodes P1, P2, and the projection B1. Recesses H2, H3 are provided on the side of the first main surface VS1 of the insulating base material 10D.

The recesses H2 and H3 are openings that are provided from the first main surface VS1 toward the inside (−Z direction) of the insulating base material 10D in the electrode non-forming portion (see the electrode non-forming portion PE in FIG. 6A). The recess H2 is disposed at a position including the coil opening CP of the coil 3 when viewed from the laminating direction (Z-axis direction). The recess H3 is disposed in the coil opening CP of the coil 3 when viewed from the laminating direction (Z-axis direction). For example, the recess H3 is formed by laser etching from the first principal surface side after the insulating base material is provided.

The insulating base material 10D has a rectangular or substantially rectangular parallelepiped shape preferably made of a thermoplastic resin, for example, in which the longitudinal direction is matched with the X-axis direction. As illustrated in FIG. 10B, the insulating base material 10D is formed by sequentially laminating the plurality of insulating base material layers 11, 12, 13, 14 made of the thermoplastic resin. The configurations of the plurality of insulating base material layers 11, 12, 13, 14 are identical or substantially identical to those of the first preferred embodiment.

The configurations of coil conductors 31b, 32b, 33b and the conductors 22, 23, which are provided on the insulating base material layers 11, 12, 13, are identical or substantially identical to those of the coil conductors 31, 32, 33 and the conductors 22, 23 of the first preferred embodiment.

A coil conductor 34b and the conductor 24 are provided on the surface of the insulating base material layer 14. The coil conductor 34b is a rectangular or substantially rectangular spiral conductor including about 2 turns disposed near the center of the insulating base material layer 14. The configuration of the conductor 24 is identical or substantially identical to that of the first preferred embodiment.

The two mounting electrodes P1, P2 are provided on the surface of the insulating base material layer 15. The configurations of the mounting electrodes P1, P2 are identical or substantially identical to those of the mounting electrodes P1, P2 of the first preferred embodiment. As described in detail later, the recesses H2, H3 provided in the insulating base material layer 15 in FIG. 10B are openings that are formed during the formation of the insulating base material or after the formation of the insulating base material. Thus, the recesses H2, H3 are not provided in the insulating base material layer 15 in a sheet state before the formation of the insulating base material.

A rectangular or substantially rectangular helical coil 3B including about 7 turns is provided in the electronic component 106 while the electronic component 106 includes coil conductors 31b, 32b, 33b, 34b provided on the plurality of insulating base material layers 11, 12, 13, 14, respectively, and the interlayer connection conductors V32, V33, V34.

As illustrated in FIG. 10A, the inner peripheral portion (1-turn portion located on the innermost periphery of the coil conductor 34b) of the coil conductor 34b is separated from the first main surface VS1 in the Z-axis direction as compared to the outer peripheral portion (1-turn portion located at the outermost periphery of the coil conductor 34b). The inner peripheral portions of the other coil conductors 31b, 32b, 33b are also separated from the first main surface VS1 in the Z-axis direction as compared to the outer peripheral portion.

In the sixth preferred embodiment, the coil conductor 34b closest to the first main surface VS1 in the Z-axis direction corresponds to the first coil conductor.

Figure 11:
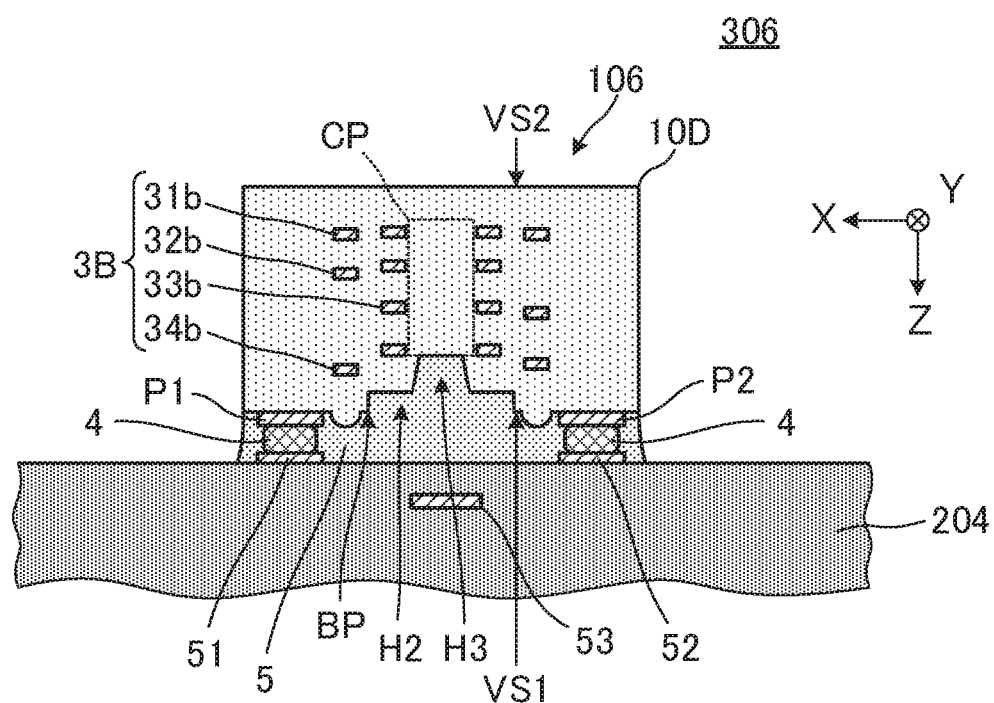
FIG. 11 is a sectional view illustrating a main portion of an electronic device 306 according to the sixth preferred embodiment of the present invention.

The state in which the electronic component 106 is mounted on the mounting substrate using the conductive bonding material and the insulating bonding material will be described below with reference to the drawing. FIG. 11 is a sectional view illustrating a main portion of an electronic device 306 of the sixth preferred embodiment.

The electronic device 306 includes the electronic component 106 and the mounting substrate 204. The mounting substrate 204 is identical or substantially identical to that of the fourth preferred embodiment.

The conductors 51, 52 are connected to the mounting electrodes P1, P2, respectively, with a conductive bonding material 4 interposed therebetween. The bonding portion BP of the electronic component 106 includes the inner surfaces of the recesses H2, H3. Thus, as illustrated in FIG. 11, the insulating bonding material 5 intrudes into the recesses H2, H3 by connecting the bonding portion BP to the mounting substrate 204 with the insulating bonding material 5 interposed therebetween, and the entire or substantially the entire inner surfaces of the recesses H2, H3 contact with the insulating bonding material 5.

In the electronic component 106 of the sixth preferred embodiment, the inner peripheral portion of the coil conductor 34b (first coil conductor) is separated from the first main surface VS1 in the Z-axis direction as compared to the outer peripheral portion. In the case in which the electronic component 106 is mounted on the mounting substrate 204, a gap between the inner peripheral portion of the coil conductor 34b and the conductor 53 provided in the mounting substrate 204 increases as compared to the case in which electronic components not having the above configuration are mounted on the mounting substrate (see the electronic device 304 in FIG. 8B). Thus, the increase in stray capacitance generated between the inner peripheral portion of the coil conductor 34b and the conductor 53 is prevented even if the insulating bonding material 5 having a dielectric constant higher than that of the insulating base material 10D intrudes into the recesses H2, H3.

Figure 12:
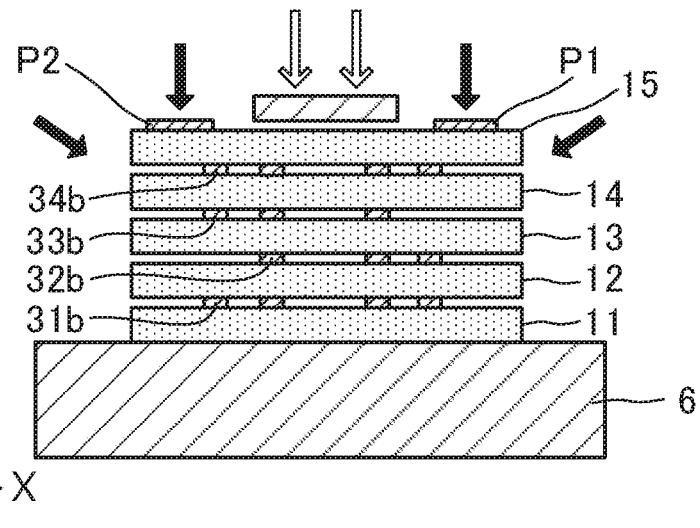
FIG. 12 is a sectional view sequentially illustrating a process of manufacturing the electronic component 106.
Figure 12:
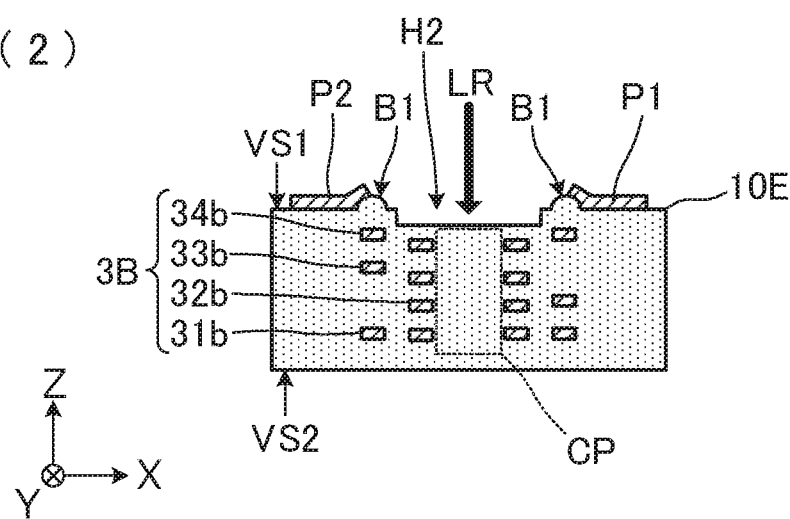
Figure 12:
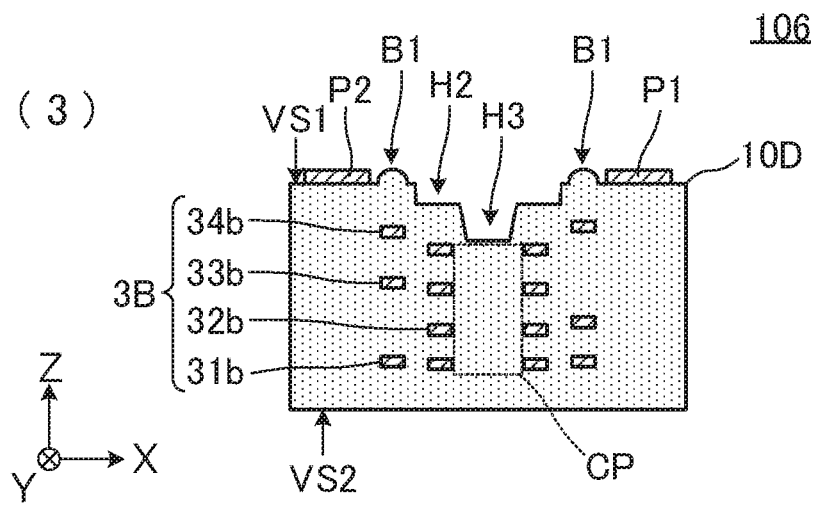

For example, the electronic component 106 of the sixth preferred embodiment is manufactured by the following non-limiting example of a process. FIG. 12 is a sectional view sequentially illustrating the process of manufacturing the electronic component 106. For convenience, only one element (piece) portion is illustrated in FIG. 12.

After the conductor forming step and the electrode forming step, as illustrated in a part (1) of FIG. 12, the insulating base material layers 11, 12, 13, 14, 15 are sequentially laminated on the high-rigidity base 6, and the plurality of laminated insulating base material layers 11, 12, 13, 14, 15 are heated and pressurized to form an insulating base material 10E. Specifically, the plurality of laminated insulating base material layers are heated, and the pressing (pressurization) is performed from the direction of the outlined arrow illustrated in (1) in FIG. 12 while a high-rigidity member 7A is disposed on a portion of the first main surface VS1 of the insulating base material 10E (on the inner peripheral portion of the coil conductor). At the same time, a portion that is not pressurized by the member 7A is subjected to the isotropic pressing (pressurization) by hydrostatic pressure from directions of arrows in the part (1) of FIG. 12.

At this time, a portion of the insulating base material 10E (above the inner peripheral portion of the coil conductor) is pressurized by the member 7A, so that the recess H2 is formed. A portion of the insulating base material 10E is pressurized by the member 7A, so that the inner peripheral portions of the plurality of coil conductors 31b, 32b, 33b, 34b are pushed down in the −Z direction and separated from the first main surface VS1 as compared to the outer peripheral portions. On the other hand, a projection B1 along the shape of the coil conductor is formed in a portion that is not pressurized by the member 7A when viewed from the Z-axis direction. For example, the member 7A is preferably a flat metal plate.

Then, as illustrated in a part (2) of FIG. 12, the recess H3 is formed by laser etching from the first main surface VS1 of the insulating base material 10E. Specifically, the inside of the coil opening CP of the coil 3B is etched using a laser beam LR to form the recess H3.

After the above steps, the aggregate substrate is separated into individual pieces to obtain the electronic component 106 as illustrated in a part (3) of FIG. 12.

The recess H3 may be formed after the separation of the aggregate substrate into the individual pieces.

Seventh Preferred Embodiment

An example in which the shape of the coil is different from the sixth preferred embodiment will be described in a seventh preferred embodiment of the present invention.

Figure 13A:
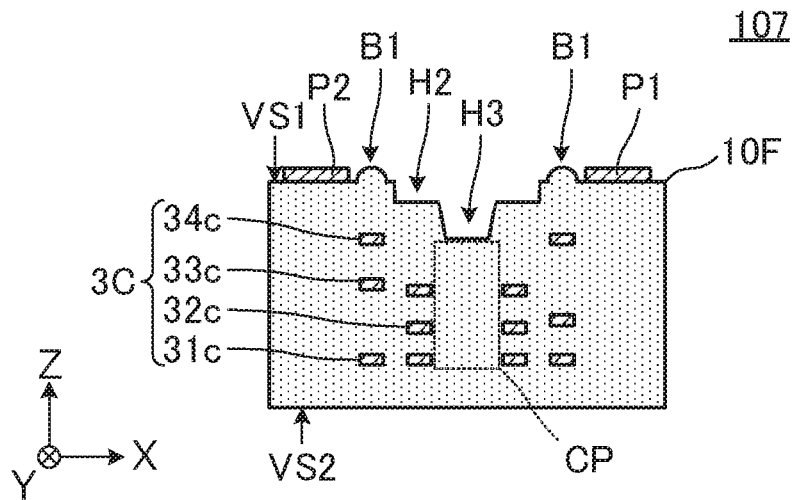
FIG. 13A is a sectional view of an electronic component 107 according to a seventh preferred embodiment of the present invention.
Figure 13B:
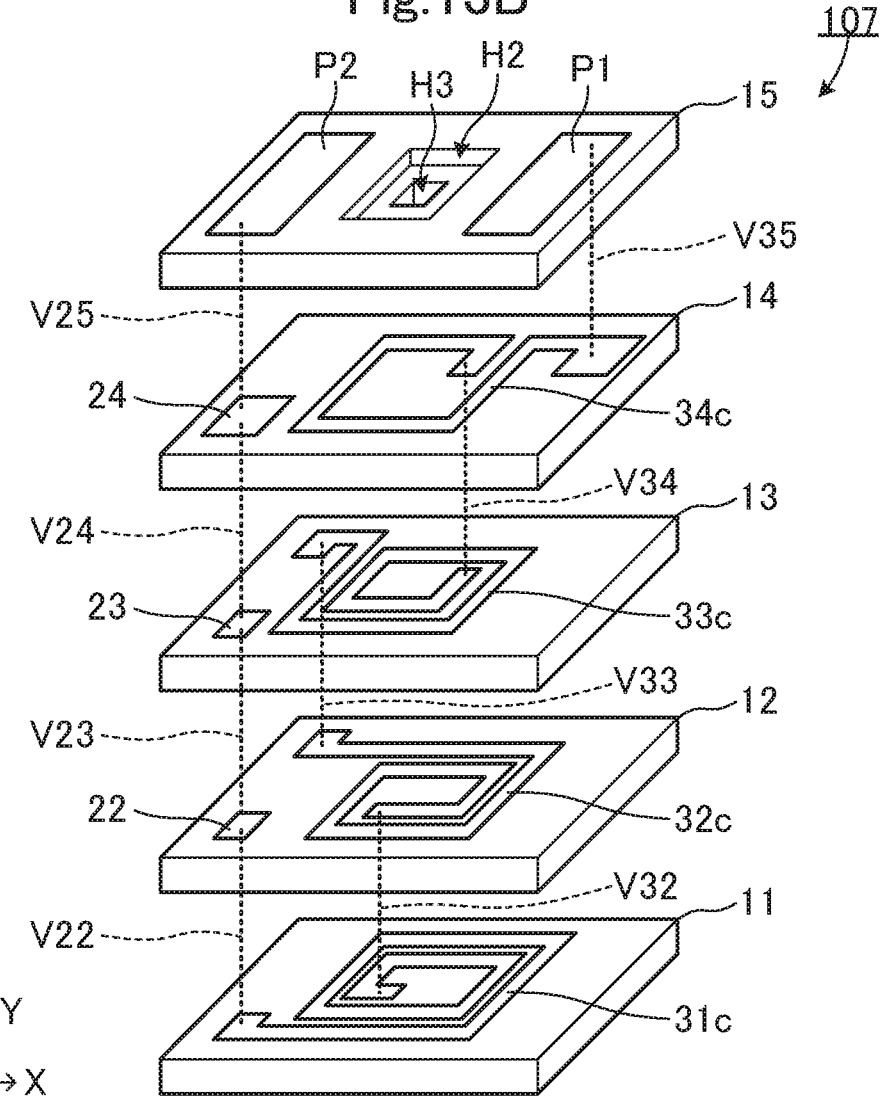
FIG. 13B is an exploded perspective view of the electronic component 107.

FIG. 13A is a sectional view of an electronic component 107 according to the seventh preferred embodiment, and FIG. 13B is an exploded perspective view of the electronic component 107.

The electronic component 107 includes an insulating base material 10F, a coil 3C (to be described in detail later) provided on the insulating base material 10F, the mounting electrodes P1, P2, and the projection B1. The configuration of the insulating base material 10F is identical or substantially identical to that of the insulating base material 10D of the sixth preferred embodiment.

The insulating base material 10F has a rectangular or substantially rectangular parallelepiped shape preferably made of a thermoplastic resin in which the longitudinal direction is matched with the X-axis direction. As illustrated in FIG. 13B, the insulating base material 10F is formed by sequentially laminating the plurality of insulating base material layers 11, 12, 13, 14 made of the thermoplastic resin. The configurations of the plurality of insulating base material layers 11, 12, 13, 14 are identical or substantially identical to those of the first preferred embodiment.

The configurations of the coil conductors 31c, 32c, 33c, the conductors 22, 23 and the mounting electrodes P1, P2 provided in the insulating base material layers 11, 12, 13, 15 are the same or substantially the same as those of the sixth preferred embodiment.

A coil conductor 34c and the conductor 24 are provided on the surface of the insulating base material layer 14. The coil conductor 34c is a rectangular or substantially rectangular spiral conductor including about 1 turn disposed near the center of the insulating base material layer 14. The coil conductor 34c overlaps the outer peripheral portions of other coil conductors 31c, 32c, 33c when viewed from the Z-axis direction when the insulating base material 10F is provided. The configuration of the conductor 24 is identical or substantially identical to that of the sixth preferred embodiment.

Similarly to the sixth preferred embodiment, the recesses H2, H3 provided in the insulating base material layer 15 in FIG. 13B are openings that are formed during the formation of the insulating base material or after the formation of the insulating base material. Thus, the recesses H2, H3 are not provided in the insulating base material layer 15 in a sheet state before the formation of the insulating base material.

The rectangular or substantially rectangular helical coil 3C including about 6 turns is provided in the electronic component 107 while the electronic component 107 includes the coil conductors 31c, 32c, 33c, 34c provided on the plurality of insulating base material layers 11, 12, 13, 14, respectively, and the interlayer connection conductors V32, V33, V34.

Figure 14:
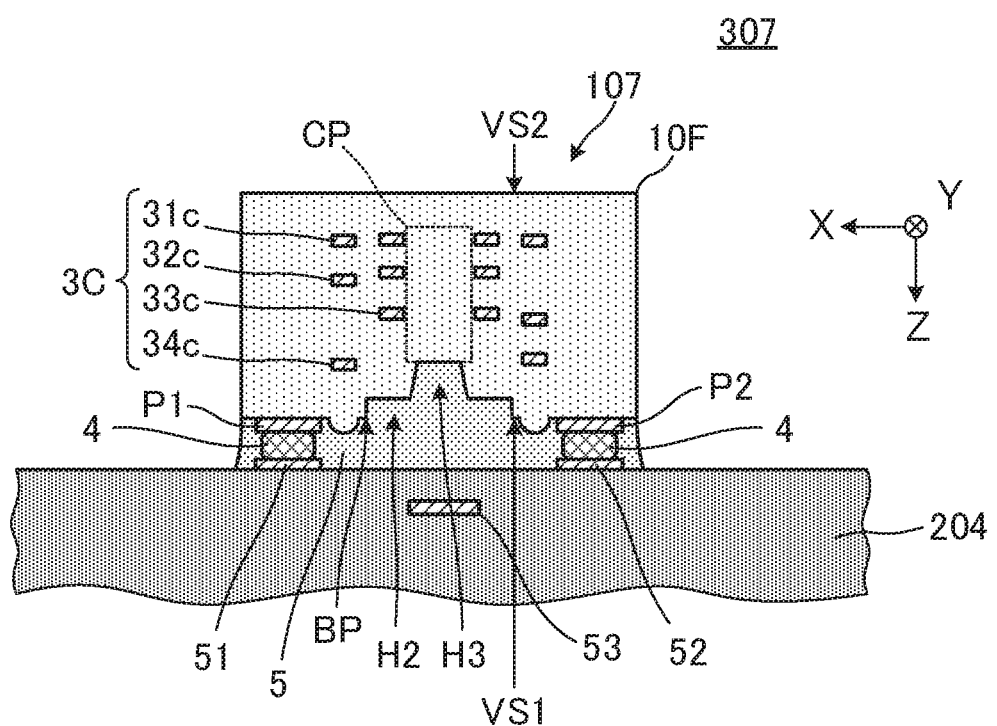
FIG. 14 is a sectional view illustrating a main portion of an electronic device 307 according to the seventh preferred embodiment of the present invention.

FIG. 14 is a sectional view illustrating a main portion of an electronic device 307 of the seventh preferred embodiment.

The electronic device 307 includes the electronic component 107 and the mounting substrate 204. The mounting substrate 204 is identical or substantially identical to that of the fourth preferred embodiment.

The conductors 51, 52 are connected to the mounting electrodes P1, P2, respectively, with a conductive bonding material 4 interposed therebetween. As illustrated in FIG. 14, the insulating bonding material 5 intrudes into the recesses H2, H3 by connecting the bonding portion BP of the electronic component 107 to the mounting substrate 204 with the insulating bonding material 5 interposed therebetween, and the entire or substantially the entire inner surfaces of the recesses H2, H3 contact with the insulating bonding material 5.

In the electronic component 107 of the seventh preferred embodiment, the coil conductor 34c (first coil conductor) has the rectangular or substantially rectangular spiral shape including about 1 turn, and overlaps the outer peripheral portions of the other coil conductors 31c, 32c, 33c when viewed from the Z-axis direction. That is, the coil conductor 34c (first coil conductor) does not include the portion corresponding to the inner peripheral portions of other coil conductors 31c, 32c, 33c. Therefore, the increase in stray capacitance generated between the coil conductor 34c and the conductor 53 provided on the mounting substrate is prevented even if the insulating bonding material 5 having the high dielectric constant intrudes in the recesses H2, H3 in the case that the electronic component 107 is mounted on the mounting substrate.

Eighth Preferred Embodiment

An example in which the shape of the insulating base material is different from the first preferred embodiment will be described in an eighth preferred embodiment of the present invention.

Figure 15:
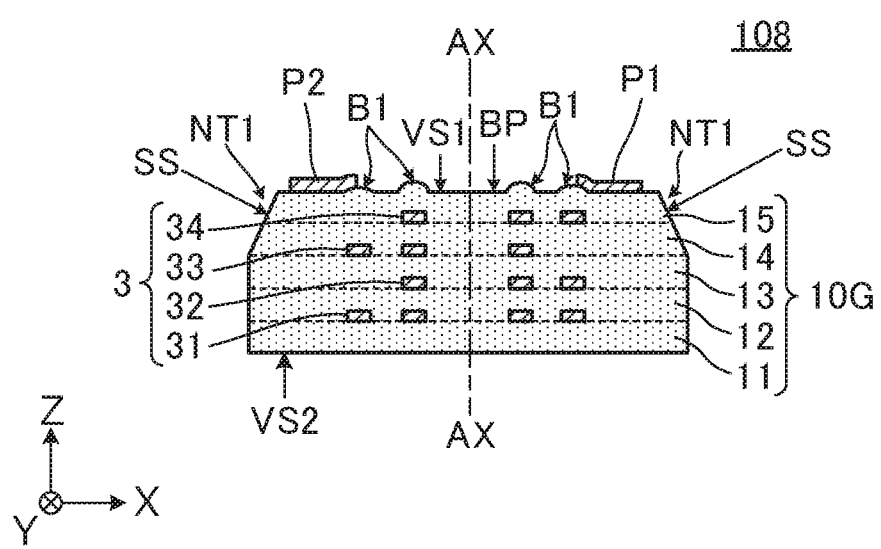
FIG. 15 is a sectional view of an electronic component 108 according to an eighth preferred embodiment of the present invention.

FIG. 15 is a sectional view of an electronic component 108 according to the eighth preferred embodiment.

The electronic component 108 is different from the electronic component 101 of the first preferred embodiment in the shape of the insulating base material. Other configurations are identical or substantially identical to those of the electronic component 101.

An insulating base material 10G includes a notch NT1 provided along the entire or substantially the entire periphery of an outer edge of the first main surface VS1 and an end surface SS defined by the notch NT1. As illustrated in FIG. 15, an area of the first main surface VS1 is smaller than an area of the second main surface VS2 in the insulating base material 10G, and the insulating base material 10G has a shape (tapered shape) that is tapered from the interface between the insulating base material layer 13 and the insulating base material layer 14 toward the first main surface VS1 (+Z direction). Consequently, in the electronic component 108, the area of the first main surface VS1 is different from the area of the first main surface VS1 in a section (a section in an XY-plane) parallel or substantially parallel to the first main surface VS1, and is smaller than a section closest to the surface VS1 (for example, the interface between the insulating base material layer 14 and the insulating base material layer 15, which are parallel or substantially parallel to the XY-plane and are located in the −Z direction with respect to the first main surface VS1 in the insulating base material 10G in FIG. 15).

In the eighth preferred embodiment, the end surface SS defined by the notch NT1 is included in the bonding portion BP. The notch NT1 is formed by grinding a vicinity of the outer edge of the first main surface VS1 of the insulating base material 10G using a laser or other suitable method.

Figure 16:
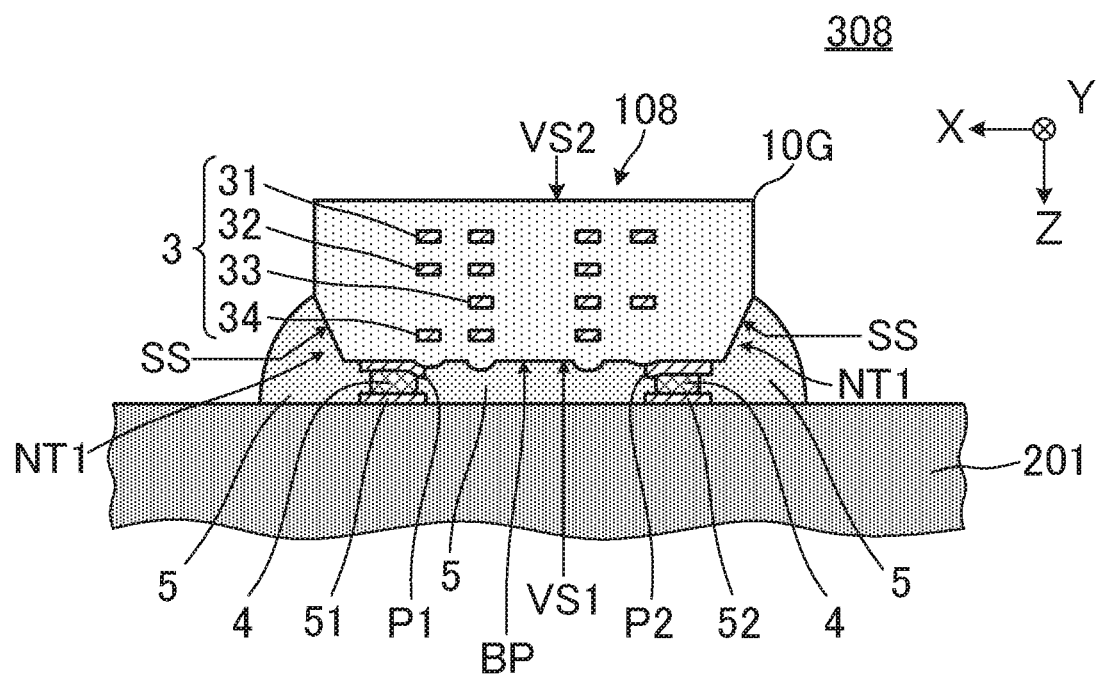
FIG. 16 is a sectional view illustrating a main portion of an electronic device 308 according to the eighth preferred embodiment of the present invention.

The state in which the electronic component 108 is mounted on the mounting substrate using the conductive bonding material and the insulating bonding material will be described below with reference to the drawings. FIG. 16 is a sectional view illustrating a main portion of an electronic device 308 of the eighth preferred embodiment.

The electronic device 308 includes the electronic component 108 and the mounting substrate 201. The mounting substrate 201 is identical or substantially identical to that of the first preferred embodiment.

The conductors 51, 52 are connected to the mounting electrodes P1, P2, respectively, with a conductive bonding material 4 interposed therebetween. The bonding portion BP (the first main surface VS1 and the end surface SS) is bonded to the mounting substrate 201 with the insulating bonding material 5 interposed therebetween.

According to the electronic component 108 of the eighth preferred embodiment, the following advantageous effects are obtained in addition to the advantageous effects of the first preferred embodiment.

In the electronic component 108 of the eighth preferred embodiment, the area of the first main surface VS1 is different from the area of the first main surface VS1 in the section (the section parallel to the XY-plane) parallel or substantially parallel to the first main surface VS1, and is smaller than the area of the section closest to the first main surface VS1. The electronic component 108 includes the notch NT1 at the outer edge of the first main surface VS1, and the end surface SS defined by the notch NT1 and the first main surface VS1 are bonded to the mounting substrate 201 with the insulating bonding material 5 interposed therebetween. With this configuration, as compared to the case (see the electronic device 302 in FIG. 6B) in which only the electrode non-forming portion (the first main surface VS1 of the insulating base material) is bonded to the mounting substrate 201 with the insulating bonding material 5 interposed therebetween, the area of the insulating base material that is in contact with the insulating bonding material 5 increases, and the bonding strength between the electronic component (insulating base material) and the insulating bonding material 5 is improved. Therefore, the bonding strength between the electronic component 108 (insulating base material 10G) and the insulating bonding material 5 is able to be improved without enlarging a mounting area of the electronic component including the insulating bonding material 5, and the electronic component in which bonding reliability to the mounting substrate or other substrate is further improved is able to be provided. Additionally, the electronic device including the mounting substrate on which the electronic component is mounted is able to be provided.

In the eighth preferred embodiment, the insulating base material 10G includes the notch NT1 provided on the entire or substantially the entire periphery of the outer edge of the first main surface VS1. However, the present invention is not limited to this configuration. The above advantageous effects are obtained when the area of the first main surface VS1 is different from the area of the first main surface VS1 in the section parallel or substantially parallel to the first main surface VS1 and when the area of the first main surface VS1 is smaller than the area of the section closest to the first main surface VS1. Consequently, for example, the insulating base material may have a trapezoidal column shape in which the area of the first main surface VS1 is smaller than the area of the second main surface VS2, namely, a shape (tapered shape) tapered from the second main surface VS2 toward the first main surface VS1 (+Z direction).

The notch NT1 may be provided in a portion of the outer edge in the first main surface VS1 of the insulating base material. The sectional shape of the notch NT1 may be an L-shape or an arc shape, for example.

Ninth Preferred Embodiment

An example of a diaphragm including the electronic components will be described in a ninth preferred embodiment of the present invention.

Figure 17A:
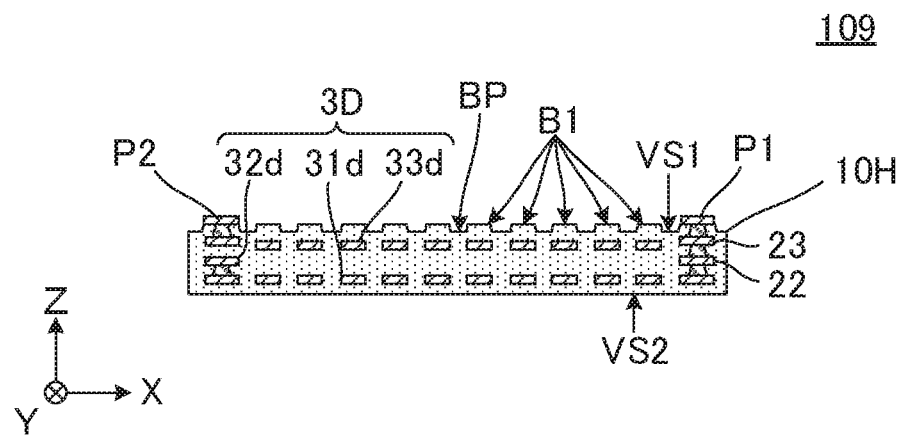
FIG. 17A is a sectional view of an electronic component 109 according to a ninth preferred embodiment of the present invention.
Figure 17B:
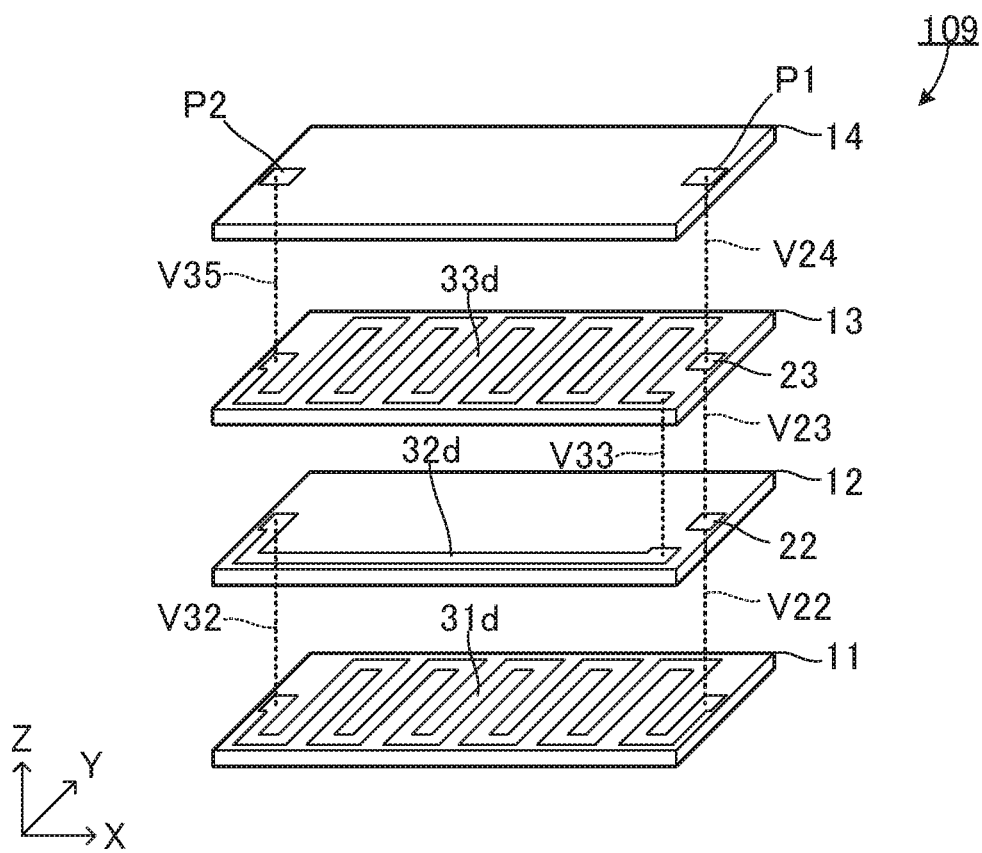
FIG. 17B is an exploded perspective view of the electronic component 109.

FIG. 17A is a sectional view of an electronic component 109 according to the ninth preferred embodiment, and FIG. 17B is an exploded perspective view of the electronic component 109.

The electronic component 109 includes an insulating base material 10H including the first main surface VS1 and a second main surface VS2 opposite to the first main surface VS1, a coil 3D (to be described in detail later) provided on the insulating base material 10H, the mounting electrodes P1, P2 provided on the first main surface VS1, and the projection B1.

The insulating base material 10H has a rectangular or substantially rectangular parallelepiped shape preferably made of a thermoplastic resin, for example, in which the longitudinal direction is matched with the X-axis direction. As illustrated in FIG. 17B, the insulating base material 10H is formed by sequentially laminating the plurality of insulating base material layers 11, 12, 13, 14 made of the thermoplastic resin. Each of the plurality of insulating base material layers 11, 12, 13, 14 is preferably a flat plate having a rectangular or substantially rectangular planar shape, and the longitudinal direction is matched with the X-axis direction.

A coil conductor 31$d$ is provided on a surface of the insulating base material layer 11. The coil conductor 31$d$ is a meander-shaped conductor extending along the longitudinal direction of the insulating base material layer 11.

A coil conductor 32$d$ and the conductor 22 are provided on the surface of the insulating base material layer 12. The coil conductor 32$d$ is a linear conductor extending approximately in the longitudinal direction of the insulating base material layer 12. The conductor 22 is a rectangular or substantially rectangular conductor disposed near the center of the first side (the left side of the insulating base material layer 12) of the insulating base material layer 12.

A coil conductor 33$d$ and the conductor 23 are provided on the surface of the insulating base material layer 13. The coil conductor 33$d$ is a meander-shaped conductor extending along the longitudinal direction of the insulating base material layer 13. The conductor 23 is a rectangular or substantially rectangular conductor disposed near the center of the first side (the left side of the insulating base material layer 13) of the insulating base material layer 13.

The two mounting electrodes P1, P2 are provided on the surface of the insulating base material layer 14. The mounting electrode P1 is a rectangular or substantially rectangular conductor disposed near the center of the first side (the left side of the insulating base material layer 14) of the insulating base material layer 14. The mounting electrode P2 is a rectangular or substantially rectangular conductor disposed near the center of the second side (the right side of the insulating base material layer 14) of the insulating base material layer 14.

As illustrated in FIG. 17B, the mounting electrode P1 is connected to the first end of the coil conductor 31$d$ through the conductors 22, 23 and the interlayer connection conductors V22, V23, V24, which are provided in the insulating base material layers 12, 13, 14. The second end of the coil conductor 31$d$ is connected to the first end of the coil conductor 32$d$ through the interlayer connection conductor V32 provided in the insulating base material layer 12. The second end of the coil conductor 32$d$ is connected to the first end of the coil conductor 33$d$ through the interlayer connection conductor V33 provided in the insulating base material layer 13. The second end of the coil conductor 33$d$ is connected to the mounting electrode P2 through the interlayer connection conductor V35 provided in the insulating base material layer 14.

In this manner, the coil 3D is provided in the electronic component 109 while the electronic component 109 includes the coil conductors 31d, 32d, 33d provided on the insulating base material layers 11, 12, 13, respectively, and the interlayer connection conductors V32, V33. The coil 3D is provided in the insulating base material 10H, and both ends of the coil 3D are connected to the mounting electrodes P1, P2, respectively.

As illustrated in FIGS. 17A and 17B, at least portions of the plurality of coil conductors 31d, 33d overlap each other when viewed from the Z-axis direction. The projection B1 is provided on the first main surface VS1 of the insulating base material 10H. The reason the projection B1 is provided is identical or substantially identical to the above-described preferred embodiments. The bonding portion BP of the insulating base material 10H in FIG. 17A includes the projection B1.

Figure 18A:
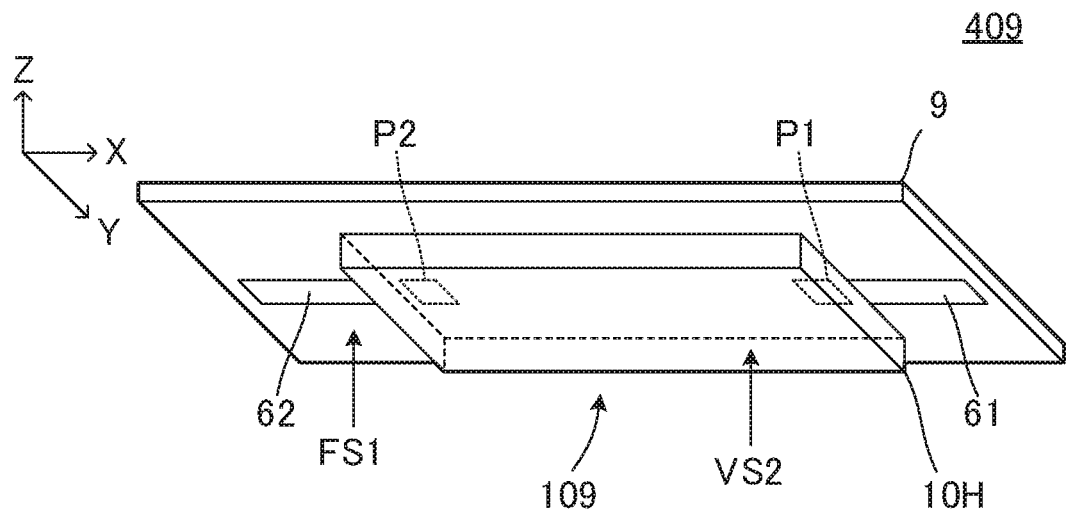
FIG. 18A is a perspective view of a diaphragm 409 according to the ninth preferred embodiment of the present invention.
Figure 18B:
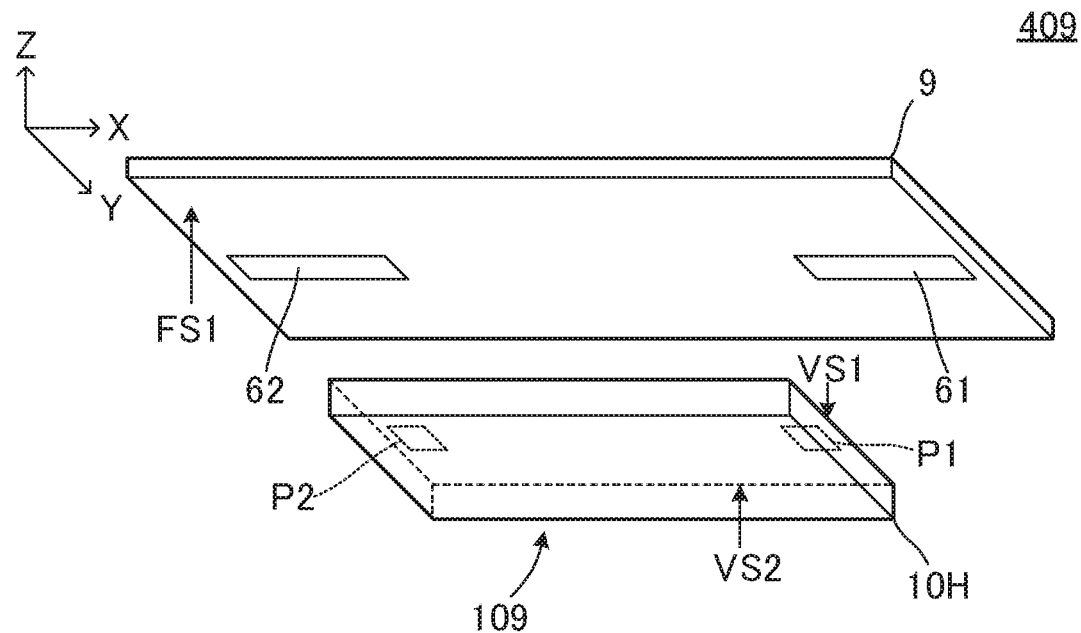
FIG. 18B is an exploded perspective view of the diaphragm 409.
Figure 19:
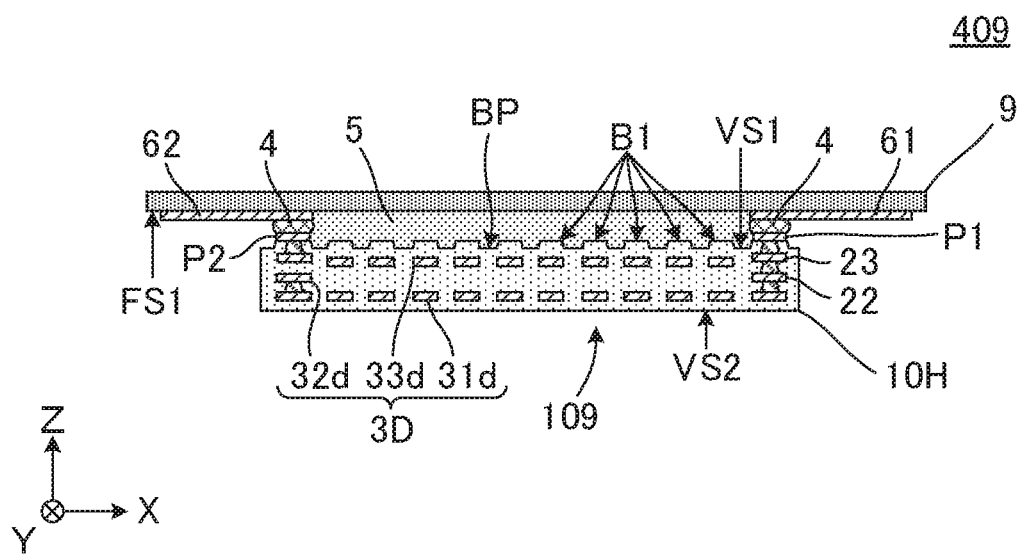
FIG. 19 is a sectional view of a diaphragm 409.

The diaphragm including the electronic component will be described with reference to the drawings. FIG. 18A is a perspective view of a diaphragm 409 of the ninth preferred embodiment, and FIG. 18B is an exploded perspective view of the diaphragm 409. FIG. 19 is a sectional view of the diaphragm 409.

The diaphragm 409 includes the electronic component 109 of the ninth preferred embodiment and a support film 9.

The support film 9 is a rectangular insulating sheet having flexibility, the longitudinal direction of the support film 9 is matched with the X-axis direction, and the support film 9 includes a first surface FS1. A thickness (a thickness in the Z-axis direction) of the support film 9 is smaller than a thickness of the insulating base material 10H. The first surface FS1 of the support film 9 is larger than the first main surface VS1 of the insulating base material 10H included in the electronic component 109. For example, the support film 9 is preferably a film made of polyetheretherketone (PEEK). While the insulating base material 10H made of LCP has an elastic modulus of about 13.3 GPa, the support film 9 preferably made of PEEK has an elastic modulus as low as about 4.2 GPa.

The electronic component 109 is fixed (mounted on) to the support film 9 while the first main surface VS1 of the insulating base material 10H is opposite to the first surface FS1 of the support film 9.

Routing conductors 61, 62 are provided on the first surface FS1 of the support film 9. The routing conductor 61 is disposed near the center of the first side (the right side of the support film 9) of the support film 9, and is a linear conductor extending in the X-axis direction. The routing conductor 62 is disposed near the center of the second side (the left side of the support film 9) of the support film 9, and is a linear conductor extending in the X-axis direction. For example, each of the routing conductors 61, 62 is preferably a conductive pattern made of a Cu foil.

The second end (the right end of the routing conductor 61) of the routing conductor 61 is connected to the mounting electrode P1 of the electronic component 109 with the conductive bonding material 4 interposed therebetween. The first end (the left end of the routing conductor 62) of the routing conductor 62 is connected to the mounting electrode P2 of the electronic component 109 with the conductive bonding material 4 interposed therebetween. The bonding portion BP in FIG. 19 is bonded to the first surface FS1 of the support film 9 with the insulating bonding material 5 interposed therebetween.

Figure 20A:
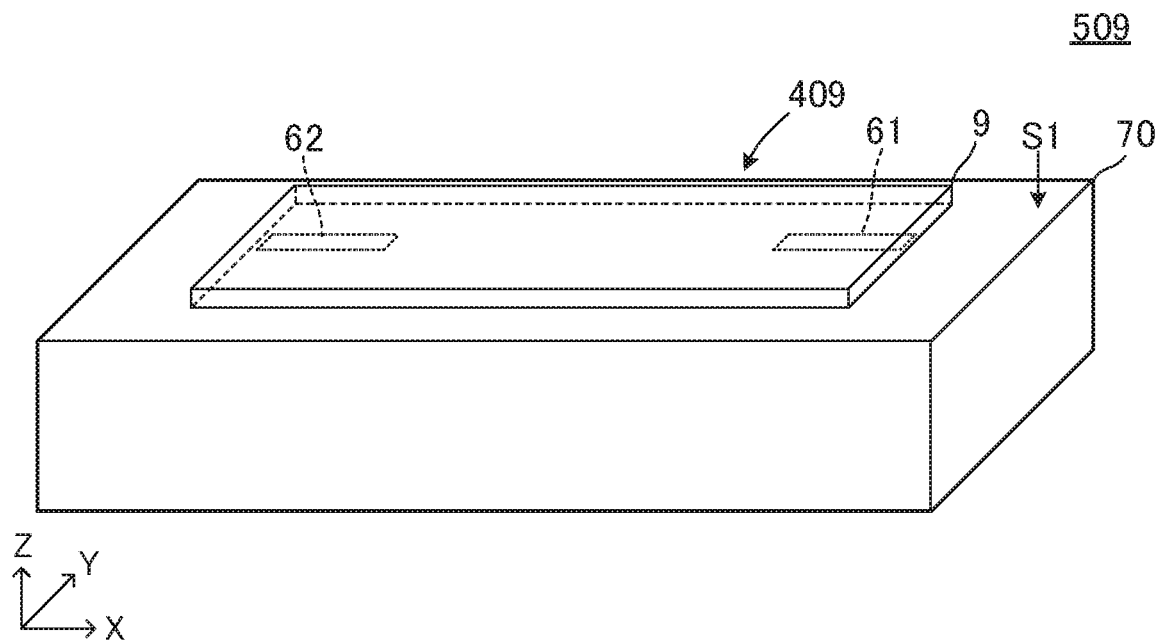
FIG. 20A is a perspective view of a vibration device 509 according to the ninth preferred embodiment of the present invention that is incorporated in an electronic device.
Figure 20B:
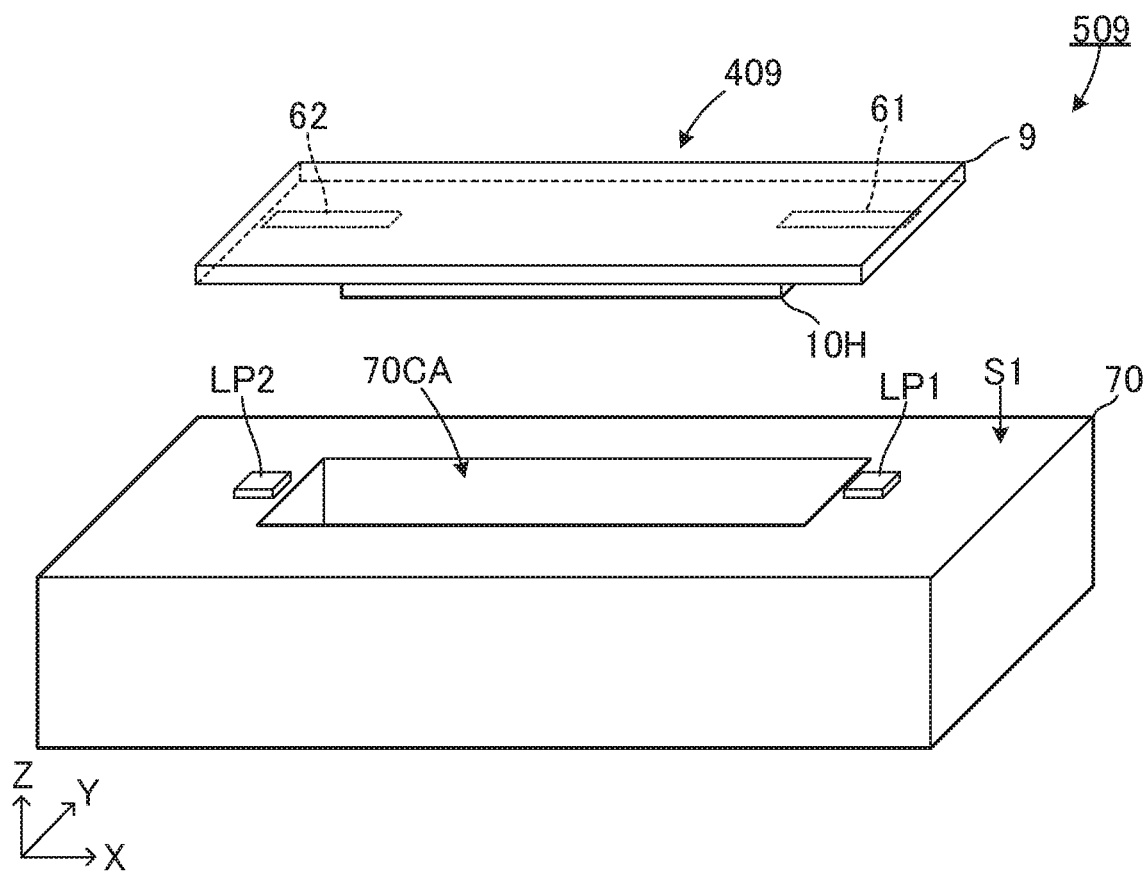
FIG. 20B is an exploded perspective view of the vibration device 509.

The electronic device including the diaphragm will be described below with reference to the drawings. FIG. 20A is a perspective view of a vibration device 509 of the ninth preferred embodiment that is incorporated in the electronic device, and FIG. 20B is an exploded perspective view of the vibration device 509.

The vibration device 509 includes a housing 70 and a vibration plate 409, and the vibration plate 409 is bonded to the housing 70. As illustrated in FIG. 20B, a recess 70CA and connection conductor patterns LP1, LP2 are provided on a first surface S1 of the housing 70. A plurality of magnets 8 are arranged in the recess 70CA.

Figure 21:
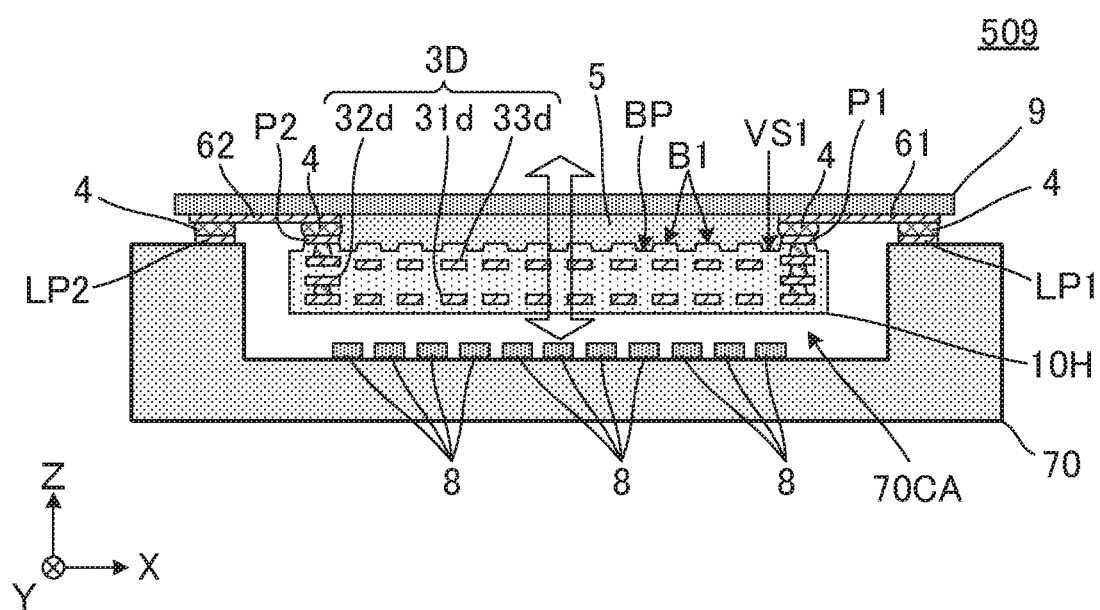
FIG. 21 is a sectional view of the vibration device 509.

FIG. 21 is a sectional view of the vibration device 509. As illustrated in FIG. 21, the diaphragm 409 is disposed on the housing 70 while the side of the first surface FS1 of the support film 9 faces the side of the first surface S1 of the housing 70, and the support film 9 is bonded to the top surface of the housing 70. As illustrated in FIG. 21, the first end (the left end of the routing conductor 61) of the routing conductor 61 is connected to the connection conductor pattern LP1 with the conductive bonding material 4 interposed therebetween. The second end (the right end of the routing conductor 62) of the routing conductor 62 is connected to the connection conductor pattern LP2 with the conductive bonding material 4 interposed therebetween. An edge end of the support film 9 is connected to the first surface S1 of the housing 70 with an adhesive layer (not illustrated) interposed therebetween.

The plurality of magnets 8 are disposed between conductor patterns of the coil conductors 31d, 33d such that an S pole and an N pole are alternately opposite to each other. The housing 70 includes terminals (not illustrated) electrically connected to the connection conductor patterns LP1, LP2. The terminal is connected to a circuit of the electronic device to incorporate the vibration device 509 of the ninth preferred embodiment in the electronic device. A driving current flows in the coil conductors 31d, 32d, 33d of the diaphragm 409 through the connection conductor patterns LP1, LP2, such that the diaphragm 409 vibrates in the direction indicated by outlined arrows in FIG. 21.

According to the ninth preferred embodiment, the following advantageous effects are obtained.

When the diaphragm 409 vibrates, a stress is generated at the interface between the insulating base material 10H and the support film 9, and peeling easily occurs at the interface between the bonding portion BP of the insulating base material 10H and the insulating bonding material 5. In the ninth preferred embodiment, the projection B1 is provided at the bonding portion BP, which is in contact with the insulating bonding material 5 while being fixed (mounted) to the support film 9. Consequently, the surface area of the bonding portion BP (the portion at which the insulating base material 10H and the insulating bonding material 5 contact each other) increases as compared to the case in which the projection B1 is not provided in the bonding portion BP, and the bonding strength between the insulating base material 10H and the insulating bonding material 5 is improved. Thus, with this configuration, the diaphragm in which the peeling of the interface between the insulating base material 10H and the insulating bonding material 5 is prevented is able to be provided.

In the case in which the insulating base material is thickened in the Z-axis direction (the laminating direction of the plurality of insulating base material layers), the peeling of the interface between the insulating base material and the insulating bonding material ever more easily occurs because the insulating base material is not significantly deformed during the vibration. Even in such cases, according to the ninth preferred embodiment, the peeling of the interface between the insulating base material and the insulating bonding material is significantly reduced or prevented.

In the ninth preferred embodiment, the support film 9 is thinner than the insulating substrate 10H, so that a displacement amplitude of the diaphragm 409 to electromagnetic force is not significantly obstructed by the support film 9.

In the ninth preferred embodiment, the coil conductors 31*d*, 32*d*, 33*d* provided on the plurality of insulating base material layers 11, 12, 13, respectively are provided, so that the compact diaphragm having the high electromagnetic force is able to be provided. Additionally, the coil conductors 31*d*, 33*d* overlap each other when viewed from the Z-axis direction, so that the coil conductor contributing to the electromagnetic force has high density of a current path.

Tenth Preferred Embodiment

An example of an electronic component in which the projection is defined by the coil conductor will be described in a tenth preferred embodiment of the present invention.

Figure 22:
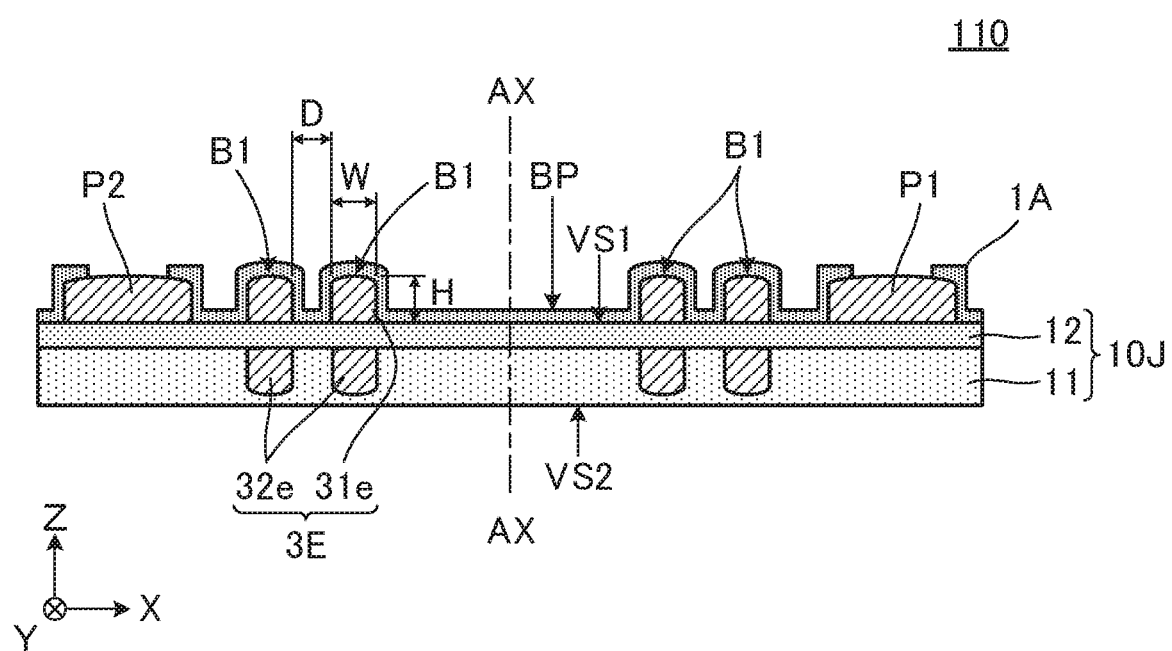
FIG. 22 is a sectional view of an electronic component 110 according to a tenth preferred embodiment of the present invention.

FIG. 22 is a sectional view of an electronic component 110 according to the tenth preferred embodiment.

The electronic component 110 includes an insulating base material 10J including the first main surface VS1 and the second main surface VS2 opposite to the first main surface VS1, a coil 3E (to be described in detail later) provided on the insulating base material 10J, the mounting electrodes P1, P2 provided on the first main surface VS1, and the projection B1.

The insulating base material 10J has a rectangular or substantially rectangular parallelepiped shape preferably made of a thermosetting resin, for example, in which the longitudinal direction is matched with the X-axis direction. As illustrated in FIG. 22, the insulating base material 10J is formed by sequentially laminating the plurality of insulating base material layers 11, 12 made of the thermosetting resin. For example, each of the insulating base material layers 11, 12 is preferably a resin sheet mainly made of an epoxy resin.

The coil conductor 31*e* and the mounting electrodes P1, P2 are provided on the first surface (corresponding to the top surface of the insulating base material layer 12 in FIG. 22, the first main surface VS1 of the insulating base material 10J) of the insulating base material layer 12. The coil conductor 31*e* is a spiral conductor wound along the outer periphery of the insulating base material layer 12. The mounting electrodes P1, P2 are rectangular or substantially rectangular conductors provided on the first surface of the insulating base material layer 12. For example, the coil conductor 31*e* and the mounting electrodes P1, P2 are preferably conductors in which a copper plating film is grown on a ground conductor to increase a film thickness.

A protective layer 1A is provided on the first surface (first main surface VS1) of the insulating base material layer 12. The protective layer 1A includes openings at positions corresponding to the mounting electrodes P1, P2. By providing the protective layer 1A on the first surface of the insulating base material layer 12, the coil conductor 31*e* is covered with the protective layer 1A, and the mounting electrodes P1, P2 are exposed from the first main surface VS1. For example, the protective layer 1A is preferably a cover film made of polyimide (PI).

A coil conductor 32*e* is provided on the second surface (the bottom surface of the insulating base material layer 12 in FIG. 22) of the insulating base material layer 12. The coil conductor 32*e* is a spiral conductor wound along the outer periphery of the insulating base material layer 12. For example, the coil conductor 32*e* is preferably a conductor in which the copper plating film is grown on the ground conductor to increase the film thickness.

The first end of the coil conductor 31*e* is connected to the mounting electrode P1, and the second end of the coil conductor 31*e* is connected to the first end of the coil conductor 32*e* (not illustrated). The second end of the coil conductor 32*e* is connected to the mounting electrode P2. As described above, in the electronic component 110, the coil 3E includes the coil conductors 31*e*, 32*e*.

For example, line widths (width W in FIG. 22) of the coil conductors 31*e*, 32*e* of the tenth preferred embodiment preferably range from about 20 µm to about 40 µm. For example, the film thickness (height H in FIG. 22) of the coil conductors 31*e*, 32*e* preferably ranges from about 40 µm to about 60 µm, and the interval between the coil conductors 31*e*, 32*e* (interval D between the coil conductors in FIG. 22) preferably ranges from about 2 µm to about 10 µm.

As illustrated in FIG. 22, in the tenth preferred embodiment, the thick coil conductor 31*e* is provided on the first main surface VS1, such the projection B1 is provided on the first main surface VS1. That is, the projection B1 is provided along the shape of the coil conductor 31*e* in planar view (viewed from the Z-axis direction) of the first main surface VS1.

In the tenth preferred embodiment, the outer edge of the section of the coil conductor 31*e* closest to the first main surface VS1 among the coil conductors 31*e*, 32*e* in a direction orthogonal or substantially orthogonal to the extending direction preferably has an arc shape. In the present invention, the term "arc" means that the outer edge of the section is roughly arc, or a rectangular shape chambered roundly.

Figure 23:
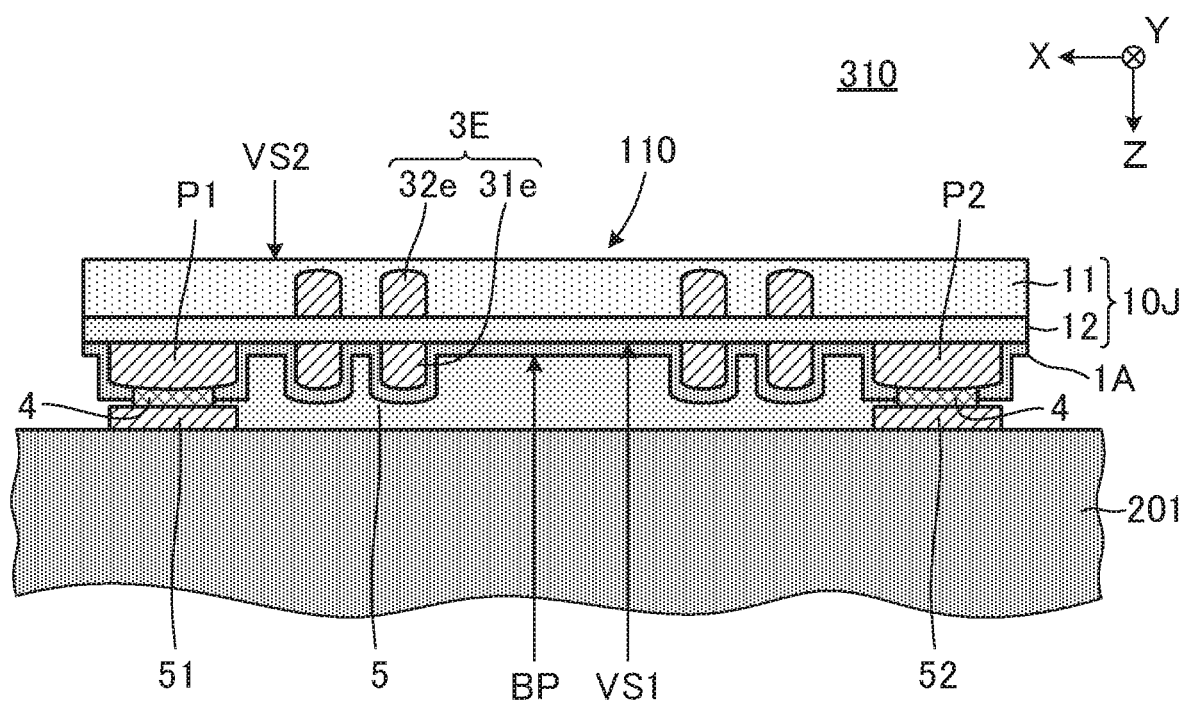
FIG. 23 is a sectional view showing a main portion of an electronic device 310 according to the tenth preferred embodiment of the present invention.

An example of an electronic device including the electronic component 110 of the tenth preferred embodiment will be described below. FIG. 23 is a sectional view showing a main portion of an electronic device 310 of the tenth preferred embodiment.

The electronic device 310 includes the electronic component 110 and the mounting substrate 201. The mounting substrate 201 is identical or substantially identical to that of the first preferred embodiment. The conductors 51, 52 provided on the main surface of the mounting substrate 201 are connected to the mounting electrodes P1, P2 with the conductive bonding material 4 interposed therebetween, respectively. The bonding portion BP (see the bonding portion BP in FIG. 2B) of the electronic component 110 is bonded to the mounting substrate 201 with the insulating bonding material 5 interposed therebetween.

Figure 24:
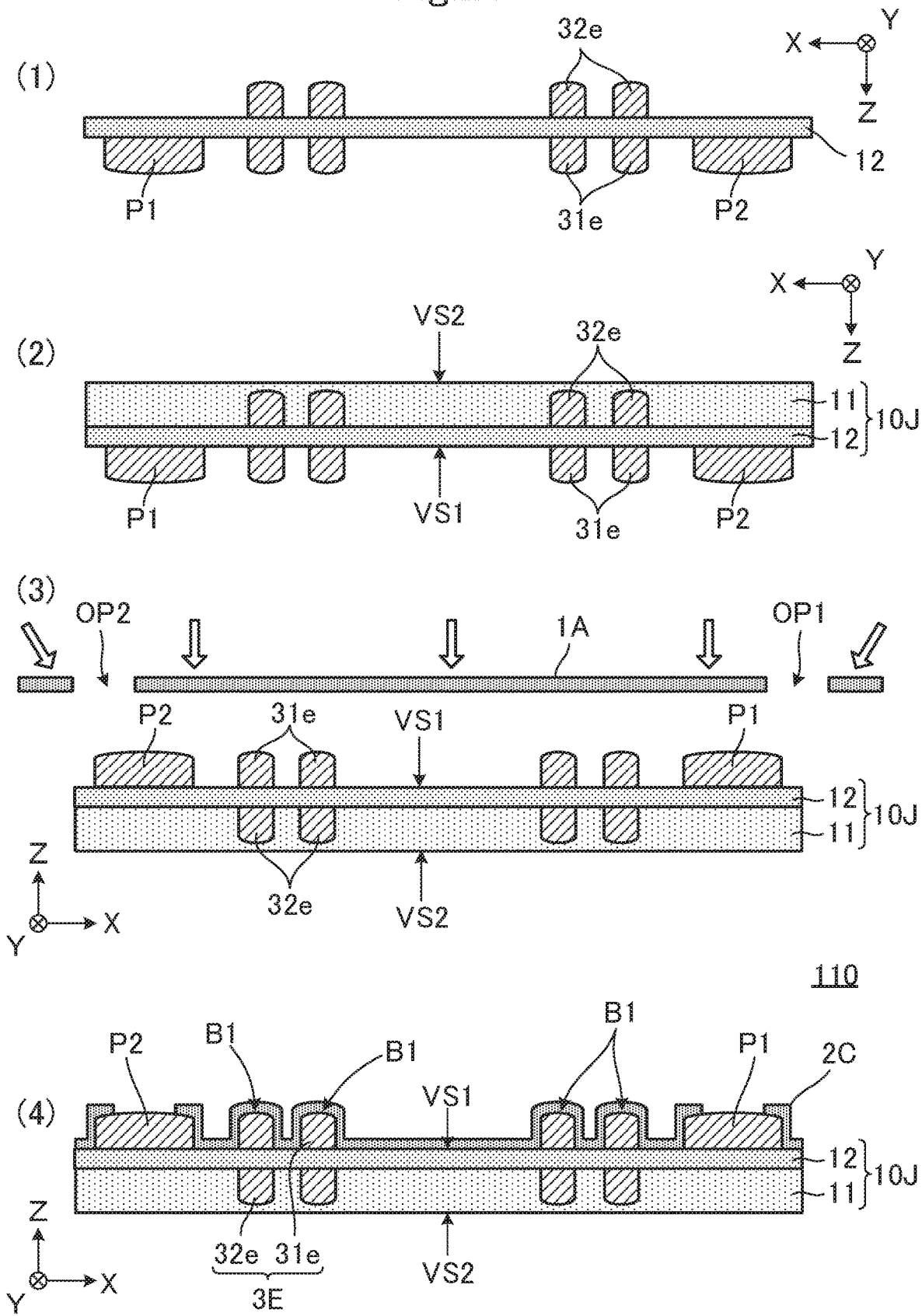
FIG. 24 is a sectional view sequentially illustrating a process of manufacturing the electronic component 110.

For example, the electronic component 110 of the tenth preferred embodiment is manufactured by the following non-limiting example of a process. FIG. 24 is a sectional view sequentially illustrating a process of manufacturing the electronic component 110. For convenience, only one element (piece) portion is illustrated in FIG. 24.

The insulating base material layer 12 is prepared as illustrated in a part (1) of FIG. 24. For example, the insulating base material layer 12 is preferably a resin sheet mainly made of an epoxy resin.

Then, the coil conductor 31*e* and the mounting electrodes P1, P2 are formed on the first surface (the top surface of the insulating base material layer 12 in a part (1) of FIG. 24) of the insulating base material layer 12, and the coil conductor 32*e* is formed on the second surface (the bottom surface of the insulating base material layer 12 in the part (1) of FIG. 24) of the insulating base material layer 12.

Specifically, after a conductor (ground conductor) defining and functioning as a ground is formed on the double-sided copper foil-clad insulating base material layer 12 by photolithography, a copper plating film is formed on the ground conductor by electroplating. Consequently, the coil conductor 31e and the mounting electrodes P1, P2 are formed on the first surface of the insulating base material layer 12, and the coil conductor 32e is formed on the second surface of the insulating base material layer 12. Through the above process, the coil conductor 31e is able to be formed with a predetermined film thickness.

The step of growing the copper plating film on the ground conductor formed on the surface of the insulating base material layer 12 to form the coil conductor 31e, the mounting electrodes P1, P2, and the projection B1 along the shapes of the coil conductor 31e is an example of the plating forming step of the invention.

Then, as illustrated in a part (2) of FIG. 24, the insulating base material layer 11 is laminated on the second surface of the insulating base material layer 12 to form the insulating base material 10H. For example, the insulating base material layer 11 is formed by applying a liquid epoxy resin onto the second surface of the insulating base material layer 12. Consequently, in the insulating base material layer 11, the surface on the opposite side to the surface that is in contact with the second surface of the insulating base material layer 12 (the bottom surface of the insulating base material layer 11 in the part (2) of FIG. 24, and the surface corresponds to the second main surface VS2 of the insulating base material 10J) becomes a smooth surface. The second main surface VS2 of the insulating base material 10J can be leveled by laminating the insulating base material layer 11 in this way.

Then, as illustrated in a part (3) of FIG. 24, the protective layer 1A is formed on the first surface (the first main surface VS1 of the insulating base material 10J) of the insulating base material layer 12. The protective layer 1A is bonded to the first surface of the insulating base material layer 12 with, for example, an adhesive (not illustrated) interposed therebetween. In the protective layer 1A, openings OP1, OP2 are formed at positions corresponding to the mounting electrodes P1, P2. For this reason, by covering the first surface of the insulating base material layer 12 with the protective layer 1A, the coil conductor 31e is covered with the protective layer 1A, and the mounting electrodes P1, P2 are exposed from the first main surface VS1. For example, the protective layer 1A is preferably a cover film made of polyimide (PI).

The thickness (the thickness in the Z axis direction) of the protective layer 1A is preferably smaller than the thickness of the coil conductor 31e. Consequently, the shape of the projection B1 is maintained without leveling the first main surface VS1 by the protective layer 1A.

Finally, the electronic component 110 illustrated in a part (4) of FIG. 24 is obtained by separating the aggregate substrate into individual pieces.

According to the electronic component 110 of the tenth preferred embodiment, the thickness of the coil conductor 31e is able to be easily increased by growing the plating film. Consequently, the projection B1 is able to be easily formed along the coil conductor 31e.

As described in the tenth preferred embodiment, by growing the plating film to form the coil conductors 31e, 32e, the coil conductor having a high aspect ratio is able to be easily formed, and a pitch of the coil conductors is able to be narrowed (the interval between the coil conductors can be narrowed) while a conductor loss of the coil conductor is able to be reduced. By growing the plating film to form the coil conductor, the high (large projection amount) projection is easily formed, and the bonding strength between the insulating base material and the insulating bonding material is improved.

In the tenth preferred embodiment, the insulating base material layer 11 is preferably formed by applying the liquid epoxy resin. However, the insulating base material layer 11 is not limited to the one formed by the above forming method. For example, the insulating base material layer 11 may be formed by laminating a prepreg resin sheet in a semi-cured state on the second surface of the insulating base material layer 12, and by heating and pressurizing the prepreg resin sheet.

In the tenth preferred embodiment, the insulating base material layers 11, 12 are preferably laminated to form the insulating base material 10J. However, the insulating base material layer 11 is not necessarily provided. That is, the insulating base material may be constructed with one insulating base material layer. The insulating base material may be formed by laminating the insulating base material layers (the insulating base material layer 12 in the tenth preferred embodiment) on which the coil conductors 31e, 32e are formed.

In the tenth preferred embodiment, by way of example, the protective layer 1A that defines the cover film is formed on the first main surface VS1. However, the protective layer 1A is not limited to the one formed by the above forming method. For example, the protective layer 1A may be formed by applying a liquid epoxy resin onto the first main surface VS1. In this case, it is necessary to pay attention such that the side of the first main surface VS1 of the insulating base material 10J does not become a smooth surface by applying the liquid epoxy resin. In a preferred embodiment of the present invention, the protective layer 1A is not necessarily provided.

In the tenth preferred embodiment, by way of example, the coil 3E preferably includes the two coil conductors 31e, 32e. However, the coil may be defined by one coil conductor or three or more coil conductors.

In each of the above-described preferred embodiments, by way of example, the insulating base material preferably has a rectangular or substantially rectangular parallelepiped shape. However, the present invention is not limited to this shape. The shape of the insulating base material may appropriately be changed within a range in which the advantageous effects of preferred embodiments of the present invention are obtained. For example, the shape may be a cube, a polygonal prism, a cylinder, and an elliptic cylinder, and the planar shape of the insulating base material may be an L-shape, a crank shape, a T-shape, and a Y-shape.

In each of the above-described preferred embodiments, by way of example, the electronic component includes the insulating base material provided by laminating two, four, or five insulating base material layers. However, the present invention is not limited to these configurations. The number of insulating base material layers defining the electronic component may be appropriately changed within the range in which the advantageous effects of the present invention are obtained. As described in the tenth preferred embodiment, the insulating base material may include one insulating base material layer.

The coils of preferred embodiments of the present invention is not limited to the configurations of each of the above preferred embodiments. The shape of the coil and the number of windings of the coil may be appropriately changed within the range in which the advantageous effects of the present invention are obtained. For example, the coil may have a planar loop shape or a planar spiral shape. The coil conductor may be provided on at least one insulating base material layer.

In each of the above-described preferred embodiments, by way of example, the second main surface VS2 of the insulating base material is preferably planar. However, preferred embodiments of the present invention are not limited to this configuration. The second main surface VS2 may be a curved surface. The second main surface VS2 may have irregularities, or the projection may be provided on the second main surface VS2.

In each of the above-described preferred embodiments, the electronic component includes the mounting electrodes P1, P2 preferably having the rectangular or substantially rectangular planar shape. However, preferred embodiments of the present invention are not limited to this configuration. The arrangement and number of the mounting electrodes may be appropriately changed depending on a circuit configuration of the electronic component. The shape of the mounting electrode may also be appropriately changed. For example, the mounting electrode may have a square shape, a polygonal shape, a circular shape, an elliptic shape, an L-shape, and a T-shape.

In each of the above-described preferred embodiments, by way of example, only the coil is provided on the insulating base material in the electronic component. However, preferred embodiments of the present invention are not limited to this configuration. In addition to the coil, the electronic component may include a capacitor or other suitable components made of a conductor. Chip components (a resistor, an inductor, a capacitor) and other suitable components may be mounted on the electronic component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an insulating base material including a first main surface on a mounting surface side, the insulating base material including a plurality of insulating base material layers that are laminated in a lamination direction;
   a coil including a coil conductor provided on at least one of the plurality of insulating base material layers and including a winding axis extending in the lamination direction;
   a mounting electrode provided on the first main surface and connected to the coil;
   a projection provided on at least an electrode non-forming portion of the first main surface, the electrode non-forming portion including no mounting electrode; and
   a recess or a through-hole provided in the electrode non-forming portion and disposed at a position including a coil opening of the coil when viewed from the lamination direction; wherein
   the projection is provided along the coil conductor in a planar view of the first main surface;
   the coil conductor is disposed across different positions in the lamination direction; and
   a first portion of the coil conductor, which is positioned on an innermost peripheral side when viewed from a winding axis direction, is farther away from the first main surface in the lamination direction as compared to a second portion of the coil conductor which is located closest to the first main surface.

2. The electronic component according to claim 1, wherein the plurality of insulating base material layers are made of a thermoplastic resin.

3. The electronic component according to claim 2, wherein
   the coil conductor includes a plurality of coil conductors; and
   the plurality of coil conductors are provided on at least two insulating base material layers among the plurality of insulating base material layers.

4. The electronic component according to claim 2, wherein
   the plurality of insulating base material layers include a first insulating base material layer including the first main surface and a second insulating base material layer adjacent to the first insulating base material layer; and
   at least one coil conductor is disposed at an interface between the first insulating base material layer and the second insulating base material layer.

5. The electronic component according to claim 4, wherein
   the coil conductor includes a plurality of coil conductors; and
   the coil conductor disposed at the interface between the first insulating base material layer and the second insulating base material layer is larger than other coil conductors in a number of windings.

6. The electronic component according to claim 3, wherein at least portions of a plurality of the coil conductors overlap each other when viewed from the lamination direction.

7. The electronic component according to claim 2, further comprising:
   a deformation preventing member provided on at least one of the first main surface and a second main surface opposite to the first main surface, the deformation preventing member having rigidity higher than that of the insulating base material; wherein
   the insulating base material includes the second main surface.

8. The electronic component according to claim 1, wherein an outer edge of a section in a direction orthogonal or substantially orthogonal to an extending direction of the coil conductor closest to the first main surface among the coil conductors has an arc shape.

9. The electronic component according to claim 1, further comprising a dummy conductor provided on the insulating base material.

10. A diaphragm comprising:
    a flexible support film including a routing conductor; and
    an electronic component fixed to the support film by a conductive bonding material and an insulating bonding material; wherein
    the electronic component includes:
        an insulating base material including a first main surface on a mounting surface side, the insulating base material including a plurality of insulating base material layers that are laminated in a lamination direction;
        a coil including a coil conductor provided on at least one of the plurality of insulating base material layers and including a winding axis extending in the lamination direction;
        a mounting electrode provided on the first main surface and connected to the coil;

a projection provided on at least an electrode non-forming portion of the first main surface, the electrode non-forming portion including no mounting electrode; and a recess or a through-hole provided in the electrode non-forming portion and disposed at a position including a coil opening of the coil when viewed from the lamination;

the projection is provided along the coil conductor in a planar view of the first main surface;

the coil conductor is disposed across different positions in the lamination direction;

a first portion of the coil conductor, which is positioned on an innermost peripheral side when viewed from a winding axis direction, is farther away from the first main surface in the lamination direction as compared to a second portion of the coil conductor which is located closest to the first main surface;

the mounting electrode is connected to the routing conductor of the support film with the conductive bonding material interposed therebetween; and in the first main surface, a bonding portion bonded to the support film with the insulating bonding material interposed therebetween includes the projection.

11. The diaphragm according to claim 10, wherein the plurality of insulating base material layers are made of a thermoplastic resin.

12. The diaphragm according to claim 11, wherein
the coil conductor includes a plurality of coil conductors; and
the plurality of coil conductors are provided on at least two insulating base material layers among the plurality of insulating base material layers.

13. The diaphragm according to claim 11, wherein
the plurality of insulating base material layers include a first insulating base material layer including the first main surface and a second insulating base material layer adjacent to the first insulating base material layer; and
at least one coil conductor is disposed at an interface between the first insulating base material layer and the second insulating base material layer.

14. The diaphragm according to claim 13, wherein
the coil conductor includes a plurality of coil conductors; and
the coil conductor disposed at the interface between the first insulating base material layer and the second insulating base material layer is larger than other coil conductors in a number of windings.

15. An electronic device comprising:
a mounting substrate; and
an electronic component mounted on the mounting substrate by a conductive bonding material and an insulating bonding material; wherein
the electronic component includes:
an insulating base material including a first main surface on a mounting surface side, the insulating base material including a plurality of insulating base material layers that are laminated in a lamination direction;

a coil including a coil conductor provided on at least one of the plurality of insulating base material layers and having a winding axis extending in the lamination direction;

a mounting electrode provided on the first main surface and connected to the coil;

a projection provided on at least an electrode non-forming portion of the first main surface, the electrode non-forming portion including no mounting electrode; and a recess or a through-hole provided in the electrode non-forming portion and disposed at a position including a coil opening of the coil when viewed from the lamination direction;

the projection is provided along the coil conductor in a planar view of the first main surface;

the coil conductor is disposed across different positions in the lamination direction;

a first portion of the coil conductor, which is positioned on an innermost peripheral side when viewed from a winding axis direction, is farther away from the first main surface in the lamination direction as compared to a second portion of the coil conductor which is located closest to the first main surface;

the mounting electrode is connected to the mounting substrate with the conductive bonding material interposed therebetween; and in the first main surface, a bonding portion bonded to the mounting substrate with the insulating bonding material interposed therebetween includes the projection.

16. The electronic device according to claim 15, wherein the electrode non-forming portion is the bonding portion.

17. The electronic device according to claim 15, wherein the plurality of insulating base material layers are made of a thermoplastic resin.

18. The electronic device according to claim 17, further comprising:
a deformation preventing member provided on at least one of the first main surface and a second main surface opposite to the first main surface, the deformation preventing member having rigidity higher than that of the insulating base material; wherein
the insulating base material includes the second main surface.

19. The electronic device according to claim 17, further comprising:
a deformation preventing member provided on at least one of the first main surface and a second main surface opposite to the first main surface, the deformation preventing member including a linear expansion coefficient between a linear expansion coefficient of the mounting substrate and a linear expansion coefficient of the insulating base material; wherein
the insulating base material includes the second main surface.

20. The electronic device according to claim 15, wherein an outer edge of a section in a direction orthogonal or substantially orthogonal to an extending direction of the coil conductor closest to the first main surface among the coil conductors has an arc shape.

* * * * *